(12) United States Patent
Dunn et al.

(10) Patent No.: US 12,274,022 B2
(45) Date of Patent: Apr. 8, 2025

(54) ELECTRONIC DISPLAY WITH COOLING

(71) Applicant: Manufacturing Resources International, Inc., Alpharetta, GA (US)

(72) Inventors: William Dunn, Alpharetta, GA (US); Tim Hubbard, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 18/657,113

(22) Filed: May 7, 2024

(65) Prior Publication Data

US 2024/0292562 A1 Aug. 29, 2024

Related U.S. Application Data

(63) Continuation of application No. 18/243,407, filed on Sep. 7, 2023, now Pat. No. 12,207,437, which is a
(Continued)

(51) Int. Cl.
*H05K 7/20* (2006.01)
*F28D 9/00* (2006.01)
(Continued)

(52) U.S. Cl.
CPC ....... *H05K 7/202* (2013.01); *G02F 1/133385* (2013.01); *H05K 7/20136* (2013.01);
(Continued)

(58) Field of Classification Search
None
See application file for complete search history.

(56) References Cited

U.S. PATENT DOCUMENTS

| 3,858,965 A | 1/1975 | Sumita |
| 4,093,355 A | 6/1978 | Kaplit et al. |

(Continued)

FOREIGN PATENT DOCUMENTS

| AU | 2011248190 B2 | 5/2011 |
| AU | 2014287438 B2 | 1/2018 |

(Continued)

OTHER PUBLICATIONS

Samsung Electronics Co., Ltd and Samsung Electronics America, Inc. v *Manufacturing Resources International, Inc.*, Final Written Decision IPR2023-00199, Jul. 3, 2024, 78 pages.
(Continued)

*Primary Examiner* — Richard H Kim
(74) *Attorney, Agent, or Firm* — Standley Law Group LLP; Jeffrey S. Standley; Adam J. Smith

(57) ABSTRACT

Electronic display assemblies are disclosed which include a housing having an intake and an exhaust, an electronic display located within the housing, a first airflow pathway fluidly connected to an ambient environment and extending through the housing between the intake and the exhaust, a first portion of which extends proximate to a rear surface of the electronic display and a second portion of which extends rearward of, and is spaced apart from, the rear surface of the electronic display. A second airflow pathway is separated from the first airflow pathway and forms a closed, continuous pathway within the housing. At least a portion of the second airflow pathway is located rearward of the electronic display. One or more electronic assemblies for operating the electronic display assembly are located within the portion of the second airflow pathway located rearward of the electronic display.

23 Claims, 4 Drawing Sheets

Related U.S. Application Data continuation of application No. 17/967,607, filed on Oct. 17, 2022, now Pat. No. 12,108,562, which is a continuation of application No. 17/751,263, filed on May 23, 2022, now Pat. No. 11,540,418, which is a continuation of application No. 17/234,237, filed on Apr. 19, 2021, now Pat. No. 11,596,081, which is a continuation of application No. 16/933,932, filed on Jul. 20, 2020, now Pat. No. 11,013,142, which is a continuation of application No. 16/708,260, filed on Dec. 9, 2019, now Pat. No. 10,721,836, which is a continuation of application No. 15/789,331, filed on Oct. 20, 2017, now Pat. No. 10,506,740, which is a continuation of application No. 14/834,034, filed on Aug. 24, 2015, now Pat. No. 9,801,305, which is a continuation of application No. 14/050,464, filed on Oct. 10, 2013, now Pat. No. 9,119,325, which is a continuation of application No. 12/641,468, filed on Dec. 18, 2009, now Pat. No. 8,654,302, which is a continuation-in-part of application No. 12/411,925, filed on Mar. 26, 2009, now Pat. No. 8,854,595, said application No. 12/641,468 is a continuation-in-part of application No. 12/556,029, filed on Sep. 9, 2009, now Pat. No. 8,373,841, and a continuation-in-part of application No. 12/234,307, filed on Sep. 19, 2008, now Pat. No. 8,767,165, and a continuation-in-part of application No. 12/234,360, filed on Sep. 19, 2008, now abandoned, and a continuation-in-part of application No. 12/237,365, filed on Sep. 24, 2008, now Pat. No. 8,879,042, and a continuation-in-part of application No. 12/235,200, filed on Sep. 22, 2008, now abandoned, and a continuation-in-part of application No. 12/620,330, filed on Nov. 17, 2009, now Pat. No. 8,274,622, and a continuation-in-part of application No. 12/556,209, filed on Sep. 9, 2009, now Pat. No. 8,379,182.

(60) Provisional application No. 61/138,736, filed on Dec. 18, 2008, provisional application No. 61/039,454, filed on Mar. 26, 2008, provisional application No. 61/095,615, filed on Sep. 9, 2008, provisional application No. 61/033,064, filed on Mar. 3, 2008, provisional application No. 61/053,713, filed on May 16, 2008, provisional application No. 61/057,599, filed on May 30, 2008, provisional application No. 61/076,126, filed on Jun. 26, 2008, provisional application No. 61/115,333, filed on Nov. 17, 2008, provisional application No. 61/095,616, filed on Sep. 9, 2008.

(51) Int. Cl.
*F28F 3/02* (2006.01)
*G02F 1/1333* (2006.01)

(52) U.S. Cl.
CPC ..... *H05K 7/20163* (2013.01); *H05K 7/20972* (2013.01); *F28D 9/00* (2013.01); *F28F 3/02* (2013.01)

(56) References Cited

U.S. PATENT DOCUMENTS

| | | |
|---|---|---|
| 4,292,370 A | 9/1981 | Pekko |
| 4,327,803 A | 5/1982 | Muellejans et al. |
| 4,488,193 A | 12/1984 | Davis et al. |
| 4,593,978 A | 6/1986 | Mourey et al. |
| 4,634,225 A | 1/1987 | Haim et al. |
| 4,748,765 A | 6/1988 | Martin |
| 4,763,993 A | 8/1988 | Vogeley et al. |
| 4,896,218 A | 1/1990 | Vick |
| 4,921,041 A | 5/1990 | Akachi |
| 4,952,783 A | 8/1990 | Aufderheide et al. |
| 4,952,925 A | 8/1990 | Haastert |
| 4,976,536 A | 12/1990 | Vogeley et al. |
| 5,002,118 A | 3/1991 | Olmstead et al. |
| 5,029,982 A | 7/1991 | Nash |
| 5,088,806 A | 2/1992 | McCartney et al. |
| 5,132,666 A | 7/1992 | Fahs |
| 5,150,231 A | 9/1992 | Iwamoto et al. |
| 5,247,374 A | 9/1993 | Terada |
| 5,255,029 A | 10/1993 | Vogeley et al. |
| 5,282,114 A | 1/1994 | Stone |
| 5,285,677 A | 2/1994 | Oehler |
| 5,293,930 A | 3/1994 | Pitasi |
| 5,351,176 A | 9/1994 | Smith et al. |
| 5,432,526 A | 7/1995 | Hyatt |
| 5,535,816 A | 7/1996 | Ishida |
| 5,559,614 A | 9/1996 | Urbish et al. |
| 5,621,614 A | 4/1997 | O'Neill |
| 5,657,641 A | 8/1997 | Cunningham et al. |
| 5,748,269 A | 5/1998 | Harris et al. |
| 5,765,743 A | 6/1998 | Sakiura et al. |
| 5,767,489 A | 6/1998 | Ferrier |
| 5,808,418 A | 9/1998 | Pitman et al. |
| 5,818,010 A | 10/1998 | McCann |
| 5,818,694 A | 10/1998 | Daikoku et al. |
| 5,835,179 A | 11/1998 | Yamanaka |
| 5,864,465 A | 1/1999 | Liu |
| 5,869,818 A | 2/1999 | Kim |
| 5,869,919 A | 2/1999 | Sato et al. |
| 5,903,433 A | 5/1999 | Gudmundsson |
| 5,920,367 A | 7/1999 | Kajimoto et al. |
| 5,991,153 A | 11/1999 | Heady et al. |
| 6,003,015 A | 12/1999 | Kang et al. |
| 6,007,205 A | 12/1999 | Fujimori |
| 6,020,945 A | 2/2000 | Sawai et al. |
| 6,043,979 A | 3/2000 | Shim |
| 6,089,751 A | 7/2000 | Conover et al. |
| 6,104,451 A | 8/2000 | Matsuoka et al. |
| 6,125,565 A | 10/2000 | Hillstrom |
| 6,157,432 A | 12/2000 | Helbing |
| 6,181,070 B1 | 1/2001 | Dunn et al. |
| 6,191,839 B1 | 2/2001 | Briley et al. |
| 6,198,222 B1 | 3/2001 | Chang |
| 6,211,934 B1 | 4/2001 | Habing et al. |
| 6,215,655 B1 | 4/2001 | Heady et al. |
| 6,244,333 B1 | 6/2001 | Bergh et al. |
| 6,351,381 B1 | 2/2002 | Bilski et al. |
| 6,359,390 B1 | 3/2002 | Nagai |
| 6,392,727 B1 | 5/2002 | Larson et al. |
| 6,405,463 B1 | 6/2002 | Roddy et al. |
| 6,417,900 B1 | 7/2002 | Shin et al. |
| 6,428,198 B1 | 8/2002 | Saccomanno et al. |
| 6,437,673 B1 | 8/2002 | Nishida et al. |
| 6,473,150 B1 | 10/2002 | Takushima et al. |
| 6,476,883 B1 | 11/2002 | Salimes et al. |
| 6,493,440 B2 | 12/2002 | Gromatsky et al. |
| 6,496,236 B1 | 12/2002 | Cole et al. |
| 6,504,713 B1 | 1/2003 | Pandolfi et al. |
| 6,535,266 B1 | 3/2003 | Nemeth et al. |
| 6,628,355 B1 | 9/2003 | Takahara |
| 6,643,130 B1 | 11/2003 | DeMarchis et al. |
| 6,683,639 B2 | 1/2004 | Driessen-Olde Scheper et al. |
| 6,701,143 B1 | 3/2004 | Dukach et al. |
| 6,714,410 B2 | 3/2004 | Wellhofer |
| 6,727,468 B1 | 4/2004 | Nemeth |
| 6,742,583 B2 | 6/2004 | Tikka |
| 6,800,378 B2 | 10/2004 | Hawa et al. |
| 6,807,051 B2 | 10/2004 | Takahashi |
| 6,812,851 B1 | 11/2004 | Dukach et al. |
| 6,825,828 B2 | 11/2004 | Burke et al. |
| 6,833,992 B2 | 12/2004 | Kusaka et al. |
| 6,839,104 B2 | 1/2005 | Taniguchi et al. |
| 6,850,209 B2 | 2/2005 | Mankins et al. |
| 6,885,412 B2 | 4/2005 | Ohnishi et al. |
| 6,886,942 B2 | 5/2005 | Okada et al. |

(56) References Cited

U.S. PATENT DOCUMENTS

| | | |
|---|---|---|
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,961,108 B2 | 11/2005 | Wang et al. |
| 7,015,470 B2 | 3/2006 | Faytlin et al. |
| 7,059,757 B2 | 6/2006 | Shimizu |
| 7,083,285 B2 | 8/2006 | Hsu et al. |
| 7,157,838 B2 | 1/2007 | Thielemans et al. |
| 7,161,803 B1 | 1/2007 | Heady |
| 7,164,586 B2 | 1/2007 | Lin |
| 7,170,759 B2 | 1/2007 | Soga |
| 7,190,416 B2 | 3/2007 | Paukshto et al. |
| 7,190,587 B2 | 3/2007 | Kim et al. |
| 7,209,349 B2 | 4/2007 | Chien et al. |
| 7,210,839 B2 | 5/2007 | Jung et al. |
| 7,212,403 B2 | 5/2007 | Rockenfell |
| 7,259,964 B2 | 8/2007 | Yamamura et al. |
| 7,269,023 B2 | 9/2007 | Nagano |
| 7,284,874 B2 | 10/2007 | Jeong et al. |
| 7,342,789 B2 | 3/2008 | Hall et al. |
| 7,396,145 B2 | 7/2008 | Wang et al. |
| 7,447,018 B2 | 11/2008 | Lee et al. |
| 7,452,121 B2 | 11/2008 | Cho et al. |
| 7,457,113 B2 | 11/2008 | Kumhyr et al. |
| 7,466,546 B2 | 12/2008 | Park |
| 7,480,140 B2 | 1/2009 | Hara et al. |
| 7,492,589 B2 | 2/2009 | Park |
| 7,518,864 B2 | 4/2009 | Kimura |
| 7,535,543 B2 | 5/2009 | Dewa et al. |
| 7,591,508 B2 | 9/2009 | Chang |
| 7,602,469 B2 | 10/2009 | Shin |
| D608,775 S | 1/2010 | Leung |
| 7,667,964 B2 | 2/2010 | Kang et al. |
| 7,682,047 B2 | 3/2010 | Hsu et al. |
| 7,752,858 B2 | 7/2010 | Johnson et al. |
| 7,753,567 B2 | 7/2010 | Kang et al. |
| 7,762,707 B2 | 7/2010 | Kim et al. |
| 7,800,706 B2 | 9/2010 | Kim et al. |
| 7,813,124 B2 | 10/2010 | Karppanen |
| 7,864,258 B2 | 1/2011 | Cho et al. |
| 7,868,951 B2 | 1/2011 | Maruta et al. |
| 7,903,416 B2 | 3/2011 | Chou |
| 7,995,342 B2 | 8/2011 | Nakamichi et al. |
| 8,004,648 B2 | 8/2011 | Dunn |
| 8,035,968 B2 | 10/2011 | Kwon et al. |
| 8,081,267 B2 | 12/2011 | Moscovitch et al. |
| 8,081,465 B2 | 12/2011 | Nishiura |
| 8,102,173 B2 | 1/2012 | Merrow |
| 8,102,483 B2 | 1/2012 | Perry et al. |
| 8,142,027 B2 | 3/2012 | Sakai |
| 8,189,134 B2 | 5/2012 | LeCave |
| 8,208,115 B2 | 6/2012 | Dunn |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| 8,300,203 B2 | 10/2012 | Nakamichi et al. |
| 8,310,824 B2 | 11/2012 | Dunn et al. |
| 8,320,119 B2 | 11/2012 | Isoshima et al. |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 8,400,608 B2 | 3/2013 | Takahashi et al. |
| 8,462,497 B2 | 6/2013 | Li et al. |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,590,602 B2 | 11/2013 | Fernandez |
| 8,649,170 B2 | 2/2014 | Dunn et al. |
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| 8,749,749 B2 | 6/2014 | Hubbard |
| 8,755,021 B2 | 6/2014 | Hubbard |
| 8,758,144 B2 | 6/2014 | Williams et al. |
| 8,760,613 B2 | 6/2014 | Dunn |
| 8,767,165 B2 | 7/2014 | Dunn |
| 8,773,633 B2 | 7/2014 | Dunn et al. |
| 8,804,091 B2 | 8/2014 | Dunn et al. |
| 8,823,916 B2 | 9/2014 | Hubbard et al. |
| 8,827,472 B2 | 9/2014 | Takada |
| 8,854,572 B2 | 10/2014 | Dunn |
| 8,854,595 B2 | 10/2014 | Dunn |
| 8,879,042 B2 | 11/2014 | Dunn |
| 8,976,313 B2 | 3/2015 | Kim et al. |
| 8,988,647 B2 | 3/2015 | Hubbard |
| 9,030,641 B2 | 5/2015 | Dunn |
| 9,089,079 B2 | 7/2015 | Dunn |
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 | 10/2015 | Dunn |
| 9,282,676 B1 | 3/2016 | Diaz |
| 9,285,108 B2 | 3/2016 | Dunn et al. |
| 9,313,917 B2 | 4/2016 | Dunn et al. |
| 9,335,579 B2 | 5/2016 | Onoue |
| 9,338,923 B2 | 5/2016 | Lee et al. |
| 9,357,673 B2 | 5/2016 | Chin |
| 9,370,127 B2 | 6/2016 | Dunn |
| 9,414,516 B2 | 8/2016 | Chin et al. |
| 9,448,569 B2 | 9/2016 | Schuch et al. |
| 9,451,060 B1 | 9/2016 | Bowers et al. |
| 9,451,733 B2 | 9/2016 | Dunn et al. |
| 9,456,525 B2 | 9/2016 | Yoon et al. |
| 9,470,924 B2 | 10/2016 | Dunn et al. |
| 9,500,896 B2 | 11/2016 | Dunn et al. |
| 9,504,188 B1 | 11/2016 | Campbell et al. |
| 9,516,485 B1 | 12/2016 | Bowers et al. |
| 9,549,490 B1 | 1/2017 | Hubbard |
| 9,594,271 B2 | 3/2017 | Dunn et al. |
| 9,600,026 B2 | 3/2017 | Birgeoglu et al. |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 | 5/2017 | Dunn et al. |
| 9,655,289 B2 | 5/2017 | Dunn et al. |
| 9,703,230 B2 | 7/2017 | Bowers et al. |
| 9,723,765 B2 | 8/2017 | DeMars |
| 9,743,553 B2 | 8/2017 | Kim et al. |
| 9,756,739 B2 | 9/2017 | Russell-Clarke et al. |
| 9,797,588 B2 | 10/2017 | Dunn et al. |
| 9,801,305 B2 | 10/2017 | Dunn et al. |
| 9,823,690 B2 | 11/2017 | Bowers et al. |
| 9,835,893 B2 | 12/2017 | Dunn |
| 9,857,618 B2 | 1/2018 | Barnes |
| 9,861,007 B2 | 1/2018 | Yoon et al. |
| 9,894,800 B2 | 2/2018 | Dunn |
| 10,070,540 B2 | 9/2018 | Campagna et al. |
| 10,080,316 B2 | 9/2018 | Dunn et al. |
| 10,088,702 B2 | 10/2018 | Dunn et al. |
| 10,165,712 B1 | 12/2018 | Jang et al. |
| 10,180,591 B2 | 1/2019 | Lee et al. |
| 10,194,564 B2 | 1/2019 | Dunn et al. |
| 10,212,845 B2 | 2/2019 | Dunn et al. |
| 10,278,311 B2 | 4/2019 | DeMars |
| 10,278,312 B1 | 4/2019 | Davis et al. |
| 10,306,781 B2 | 5/2019 | Cho et al. |
| 10,314,212 B2 | 6/2019 | Hubbard |
| 10,359,659 B2 | 7/2019 | Dunn et al. |
| 10,359,817 B2 | 7/2019 | Yun et al. |
| 10,383,238 B2 | 8/2019 | Yun et al. |
| 10,398,066 B2 | 8/2019 | Dunn et al. |
| 10,405,456 B2 | 9/2019 | Jang et al. |
| 10,409,323 B2 | 9/2019 | Birgeoglu et al. |

(56) References Cited

U.S. PATENT DOCUMENTS

| | | |
|---|---|---|
| 10,420,257 B2 | 9/2019 | Dunn et al. |
| 10,485,113 B2 | 11/2019 | Dunn et al. |
| 10,485,147 B2 | 11/2019 | Oh et al. |
| 10,485,148 B2 | 11/2019 | Oh et al. |
| 10,488,896 B2 | 11/2019 | Simpson |
| 10,499,516 B2 | 12/2019 | Dunn et al. |
| 10,506,738 B2 | 12/2019 | Dunn |
| 10,506,740 B2 | 12/2019 | Dunn et al. |
| 10,524,384 B2 | 12/2019 | Dunn et al. |
| 10,524,397 B2 | 12/2019 | Dunn et al. |
| 10,548,247 B2 | 1/2020 | Demars |
| 10,624,218 B2 | 4/2020 | Dunn et al. |
| 10,660,245 B2 | 5/2020 | Dunn et al. |
| 10,687,446 B2 | 6/2020 | Dunn et al. |
| 10,716,224 B2 | 7/2020 | Dunn et al. |
| 10,721,836 B2 | 7/2020 | Dunn et al. |
| 10,736,245 B2 | 8/2020 | Dunn et al. |
| 10,747,261 B2 | 8/2020 | Birgeoglu et al. |
| 10,754,184 B2 | 8/2020 | Wang et al. |
| 10,757,844 B2 | 8/2020 | Dunn et al. |
| 10,795,413 B1 | 10/2020 | Dunn |
| 10,820,445 B2 | 10/2020 | Diaz |
| 10,827,656 B2 | 11/2020 | Hubbard |
| 10,827,657 B2 | 11/2020 | Lee |
| 10,905,035 B2 | 1/2021 | Whitehead et al. |
| 10,925,174 B2 | 2/2021 | Dunn et al. |
| 10,969,615 B2 | 4/2021 | Wang et al. |
| 10,973,156 B2 | 4/2021 | Dunn et al. |
| 10,983,382 B2 | 4/2021 | Takase |
| 11,013,142 B2 | 5/2021 | Dunn et al. |
| 11,016,547 B2 | 5/2021 | Whitehead et al. |
| 11,019,735 B2 | 5/2021 | Dunn |
| 11,032,923 B2 | 6/2021 | Dunn et al. |
| 11,096,317 B2 | 8/2021 | Dunn |
| 11,191,193 B2 | 11/2021 | Hubbard |
| 11,206,750 B2 | 12/2021 | Lee et al. |
| 11,470,749 B2 | 10/2022 | Dunn et al. |
| 11,477,923 B2 | 10/2022 | Brown |
| 11,507,141 B2 | 11/2022 | Dunn |
| 11,540,418 B2 | 12/2022 | Dunn et al. |
| 11,596,081 B2 | 2/2023 | Dunn et al. |
| 11,617,287 B2 | 3/2023 | Dunn |
| 11,744,036 B2 | 8/2023 | Diaz |
| 11,744,054 B2 | 8/2023 | Dunn et al. |
| 11,762,231 B2 | 9/2023 | Dunn et al. |
| 11,822,171 B2 | 11/2023 | Dunn et al. |
| 11,889,636 B2 | 1/2024 | Dunn |
| 11,919,393 B2 | 3/2024 | Dunn et al. |
| 11,934,054 B2 | 3/2024 | Dunn et al. |
| 11,966,263 B2 | 4/2024 | Dunn et al. |
| 11,968,813 B2 | 4/2024 | Dunn et al. |
| 2001/0001459 A1 | 5/2001 | Savant et al. |
| 2001/0009508 A1 | 7/2001 | Umemoto et al. |
| 2001/0019454 A1 | 9/2001 | Tadic-Galeb et al. |
| 2001/0023914 A1 | 9/2001 | Oddsen, Jr. |
| 2001/0032404 A1 | 10/2001 | Hillstrom |
| 2002/0009978 A1 | 1/2002 | Dukach et al. |
| 2002/0033919 A1 | 3/2002 | Sanelle et al. |
| 2002/0050793 A1 | 5/2002 | Cull et al. |
| 2002/0065046 A1 | 5/2002 | Mankins et al. |
| 2002/0084891 A1 | 7/2002 | Mankins et al. |
| 2002/0101553 A1 | 8/2002 | Enomoto et al. |
| 2002/0112026 A1 | 8/2002 | Fridman et al. |
| 2002/0122134 A1 | 9/2002 | Kalua |
| 2002/0126248 A1 | 9/2002 | Yoshida |
| 2002/0135741 A1 | 9/2002 | Lee et al. |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0164962 A1 | 11/2002 | Mankins et al. |
| 2002/0167637 A1 | 11/2002 | Burke et al. |
| 2003/0007109 A1 | 1/2003 | Park |
| 2003/0020679 A1 | 1/2003 | Kojima et al. |
| 2003/0020884 A1 | 1/2003 | Okada et al. |
| 2003/0043091 A1 | 3/2003 | Takeuchi et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0025389 A1 | 2/2004 | Peterson |
| 2004/0035032 A1 | 2/2004 | Milliken |
| 2004/0035558 A1 | 2/2004 | Todd et al. |
| 2004/0036622 A1 | 2/2004 | Dukach et al. |
| 2004/0036834 A1 | 2/2004 | Ohnishi et al. |
| 2004/0042174 A1 | 3/2004 | Tomioka et al. |
| 2004/0103570 A1 | 6/2004 | Ruttenberg |
| 2004/0105159 A1 | 6/2004 | Saccomanno et al. |
| 2004/0135482 A1 | 7/2004 | Thielemans et al. |
| 2004/0165139 A1 | 8/2004 | Anderson et al. |
| 2004/0207981 A1 | 10/2004 | Gorenz, Jr. et al. |
| 2004/0212548 A1 | 10/2004 | Ruttenberg |
| 2004/0223299 A1 | 11/2004 | Ghosh |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0094039 A1 | 5/2005 | Kim et al. |
| 2005/0127796 A1 | 6/2005 | Olesen et al. |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0219841 A1 | 10/2005 | Ikeda et al. |
| 2005/0229630 A1 | 10/2005 | Richter et al. |
| 2005/0237714 A1 | 10/2005 | Ebermann |
| 2005/0253699 A1 | 11/2005 | Madonia |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0012985 A1 | 1/2006 | Archie, Jr. et al. |
| 2006/0018093 A1 | 1/2006 | Lai et al. |
| 2006/0034051 A1 | 2/2006 | Wang et al. |
| 2006/0056994 A1 | 3/2006 | Van Lear et al. |
| 2006/0077636 A1 | 4/2006 | Kim |
| 2006/0081366 A1 | 4/2006 | Chiu et al. |
| 2006/0081367 A1 | 4/2006 | Chiu et al. |
| 2006/0082271 A1 | 4/2006 | Lee et al. |
| 2006/0092348 A1 | 5/2006 | Park |
| 2006/0125998 A1 | 6/2006 | Dewa et al. |
| 2006/0132699 A1 | 6/2006 | Cho et al. |
| 2006/0133090 A1 | 6/2006 | Noh et al. |
| 2006/0177587 A1 | 8/2006 | Ishizuka et al. |
| 2006/0199514 A1 | 9/2006 | Kimura |
| 2006/0209266 A1 | 9/2006 | Utsunomiya |
| 2006/0221270 A1 | 10/2006 | Ioki et al. |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0266900 A1 | 11/2006 | May et al. |
| 2006/0268194 A1 | 11/2006 | Morimoto et al. |
| 2006/0269216 A1 | 11/2006 | Wiemeyer et al. |
| 2006/0283579 A1 | 12/2006 | Ghosh et al. |
| 2007/0013647 A1 | 1/2007 | Lee et al. |
| 2007/0019419 A1 | 1/2007 | Hafuka et al. |
| 2007/0021217 A1 | 1/2007 | Wu et al. |
| 2007/0030879 A1 | 2/2007 | Hatta |
| 2007/0046874 A1 | 3/2007 | Adachi et al. |
| 2007/0047239 A1 | 3/2007 | Kang et al. |
| 2007/0065091 A1 | 3/2007 | Hinata et al. |
| 2007/0070615 A1 | 3/2007 | Joslin et al. |
| 2007/0076431 A1 | 4/2007 | Atarashi et al. |
| 2007/0081344 A1 | 4/2007 | Cappaert et al. |
| 2007/0103863 A1 | 5/2007 | Kim |
| 2007/0103866 A1 | 5/2007 | Park |
| 2007/0115686 A1 | 5/2007 | Tyberghien |
| 2007/0126335 A1 | 6/2007 | You et al. |
| 2007/0139929 A1 | 6/2007 | Yoo et al. |
| 2007/0140671 A1 | 6/2007 | Yoshimura |
| 2007/0144704 A1 | 6/2007 | Bundza et al. |
| 2007/0151164 A1 | 7/2007 | Marshall |
| 2007/0151274 A1 | 7/2007 | Roche et al. |
| 2007/0151664 A1 | 7/2007 | Shin |
| 2007/0171353 A1 | 7/2007 | Hong |

(56) References Cited

U.S. PATENT DOCUMENTS

| | | |
|---|---|---|
| 2007/0176885 A1 | 8/2007 | Jun |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0230167 A1 | 10/2007 | McMahon et al. |
| 2007/0237636 A1 | 10/2007 | Hsu |
| 2007/0253205 A1 | 11/2007 | Welker |
| 2007/0267174 A1 | 11/2007 | Kim |
| 2007/0274051 A1 | 11/2007 | Horng et al. |
| 2008/0035315 A1 | 2/2008 | Han |
| 2008/0054144 A1 | 3/2008 | Wohlford |
| 2008/0055261 A1 | 3/2008 | Cernasov |
| 2008/0055534 A1 | 3/2008 | Kawano |
| 2008/0076342 A1 | 3/2008 | Bryant et al. |
| 2008/0083527 A1 | 4/2008 | Horng et al. |
| 2008/0099193 A1 | 5/2008 | Aksamit et al. |
| 2008/0148609 A1 | 6/2008 | Ogoreve |
| 2008/0165496 A1 | 7/2008 | Kang et al. |
| 2008/0190210 A1 | 8/2008 | Harish et al. |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0267790 A1 | 10/2008 | Gaudet et al. |
| 2008/0283234 A1 | 11/2008 | Sagi et al. |
| 2008/0285290 A1 | 11/2008 | Ohashi et al. |
| 2008/0296134 A1 | 12/2008 | Hattori et al. |
| 2008/0310116 A1 | 12/2008 | O'Connor |
| 2008/0310158 A1 | 12/2008 | Harbers et al. |
| 2009/0009047 A1 | 1/2009 | Yanagawa et al. |
| 2009/0009729 A1 | 1/2009 | Sakai |
| 2009/0021461 A1 | 1/2009 | Hu et al. |
| 2009/0034188 A1 | 2/2009 | Sween et al. |
| 2009/0059518 A1 | 3/2009 | Kakikawa et al. |
| 2009/0065007 A1 | 3/2009 | Wilkinson et al. |
| 2009/0086430 A1 | 4/2009 | Kang et al. |
| 2009/0095819 A1 | 4/2009 | Brown et al. |
| 2009/0104989 A1 | 4/2009 | Williams et al. |
| 2009/0120629 A1 | 5/2009 | Ashe |
| 2009/0122218 A1 | 5/2009 | Oh et al. |
| 2009/0126906 A1 | 5/2009 | Dunn |
| 2009/0126907 A1 | 5/2009 | Dunn |
| 2009/0126914 A1 | 5/2009 | Dunn |
| 2009/0129021 A1 | 5/2009 | Dunn |
| 2009/0135365 A1 | 5/2009 | Dunn |
| 2009/0145581 A1 | 6/2009 | Hoffman et al. |
| 2009/0147170 A1 | 6/2009 | Oh et al. |
| 2009/0153780 A1 | 6/2009 | Takata |
| 2009/0154096 A1 | 6/2009 | Iyengar et al. |
| 2009/0174626 A1 | 7/2009 | Isoshima et al. |
| 2009/0231807 A1 | 9/2009 | Bouissier |
| 2009/0241437 A1 | 10/2009 | Steinle et al. |
| 2009/0244472 A1 | 10/2009 | Dunn |
| 2009/0251650 A1 | 10/2009 | Fukagawa et al. |
| 2009/0266507 A1 | 10/2009 | Turnbull et al. |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2009/0310065 A1 | 12/2009 | Dunn et al. |
| 2009/0323275 A1 | 12/2009 | Rehmann et al. |
| 2010/0060861 A1 | 3/2010 | Medin |
| 2010/0079949 A1 | 4/2010 | Nakamichi et al. |
| 2010/0079979 A1 | 4/2010 | Nakamichi et al. |
| 2010/0142149 A1 | 6/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0220249 A1 | 9/2010 | Nakamichi et al. |
| 2010/0226091 A1 | 9/2010 | Dunn |
| 2010/0232107 A1 | 9/2010 | Dunn |
| 2010/0238394 A1 | 9/2010 | Dunn |
| 2010/0315570 A1 | 12/2010 | Mathew et al. |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019363 A1 | 1/2011 | Vahlsing et al. |
| 2011/0032489 A1 | 2/2011 | Kimoto et al. |
| 2011/0051071 A1 | 3/2011 | Nakamichi et al. |
| 2011/0051369 A1 | 3/2011 | Takahara |
| 2011/0058326 A1 | 3/2011 | Idems et al. |
| 2011/0072697 A1 | 3/2011 | Miller |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1 | 4/2011 | Dunn |
| 2011/0085302 A1 | 4/2011 | Nakamichi et al. |
| 2011/0090630 A1 | 4/2011 | Bergeron et al. |
| 2011/0114384 A1 | 5/2011 | Sakamoto et al. |
| 2011/0116000 A1 | 5/2011 | Dunn et al. |
| 2011/0116231 A1 | 5/2011 | Dunn et al. |
| 2011/0122162 A1 | 5/2011 | Sato et al. |
| 2011/0134356 A1 | 6/2011 | Swatt et al. |
| 2011/0141672 A1 | 6/2011 | Farley, Jr. et al. |
| 2011/0141724 A1 | 6/2011 | Erion |
| 2011/0162831 A1 | 7/2011 | Lee et al. |
| 2011/0167845 A1 | 7/2011 | Lee et al. |
| 2011/0261523 A1 | 10/2011 | Dunn et al. |
| 2011/0297810 A1 | 12/2011 | Tachibana |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0105790 A1 | 5/2012 | Hubbard |
| 2012/0106081 A1 | 5/2012 | Hubbard et al. |
| 2012/0131936 A1 | 5/2012 | Yoshida et al. |
| 2012/0188481 A1 | 7/2012 | Kang et al. |
| 2012/0206687 A1 | 8/2012 | Dunn et al. |
| 2012/0223877 A1 | 9/2012 | Cho |
| 2012/0224116 A1 | 9/2012 | Barnes |
| 2012/0236499 A1 | 9/2012 | Murayama et al. |
| 2012/0249402 A1 | 10/2012 | Kang |
| 2012/0255704 A1 | 10/2012 | Nakamichi |
| 2012/0274876 A1 | 11/2012 | Cappaert et al. |
| 2012/0284547 A1 | 11/2012 | Culbert et al. |
| 2012/0327600 A1 | 12/2012 | Dunn |
| 2013/0170140 A1 | 7/2013 | Dunn |
| 2013/0173358 A1 | 7/2013 | Pinkus |
| 2013/0176517 A1 | 7/2013 | Kim et al. |
| 2013/0201685 A1 | 8/2013 | Messmore et al. |
| 2013/0258659 A1 | 10/2013 | Erion |
| 2013/0279154 A1* | 10/2013 | Dunn ..................... F21V 29/67 362/97.3 |
| 2013/0294039 A1 | 11/2013 | Chao |
| 2013/0299651 A1 | 11/2013 | McGowan et al. |
| 2013/0344794 A1 | 12/2013 | Shaw et al. |
| 2014/0044147 A1 | 2/2014 | Wyatt et al. |
| 2014/0085564 A1 | 3/2014 | Hendren et al. |
| 2014/0111758 A1 | 4/2014 | Dunn et al. |
| 2014/0113540 A1 | 4/2014 | Dunn et al. |
| 2014/0134767 A1 | 5/2014 | Ishida et al. |
| 2014/0184980 A1 | 7/2014 | Onoue |
| 2014/0190240 A1 | 7/2014 | He et al. |
| 2014/0268657 A1 | 9/2014 | Dunn et al. |
| 2014/0313452 A1 | 10/2014 | Dunn et al. |
| 2014/0313666 A1 | 10/2014 | Chin |
| 2014/0313698 A1 | 10/2014 | Dunn et al. |
| 2014/0314395 A1 | 10/2014 | Dunn et al. |
| 2014/0334100 A1 | 11/2014 | Yoon et al. |
| 2014/0361138 A1 | 12/2014 | Ramirez et al. |
| 2015/0009625 A1 | 1/2015 | Chin et al. |
| 2015/0009627 A1 | 1/2015 | Dunn et al. |
| 2015/0087404 A1 | 3/2015 | Lesley et al. |
| 2015/0192371 A1 | 7/2015 | Hancock |
| 2015/0253611 A1 | 9/2015 | Yang et al. |
| 2015/0264826 A1 | 9/2015 | Dunn et al. |
| 2015/0319882 A1 | 11/2015 | Dunn et al. |
| 2015/0366101 A1 | 12/2015 | Dunn et al. |
| 2015/0371571 A1 | 12/2015 | Häger |
| 2016/0014910 A1 | 1/2016 | Campagna et al. |
| 2016/0041423 A1 | 2/2016 | Dunn |
| 2016/0044829 A1 | 2/2016 | Dunn |

(56) References Cited

U.S. PATENT DOCUMENTS

| | | |
|---|---|---|
| 2016/0162297 A1 | 6/2016 | Shao |
| 2016/0192536 A1 | 6/2016 | Diaz |
| 2016/0195254 A1 | 7/2016 | Dunn et al. |
| 2016/0198588 A1 | 7/2016 | DeMars |
| 2016/0238876 A1 | 8/2016 | Dunn et al. |
| 2016/0242329 A1 | 8/2016 | DeMars |
| 2016/0242330 A1 | 8/2016 | Dunn |
| 2016/0249493 A1 | 8/2016 | Dunn et al. |
| 2016/0265759 A1 | 9/2016 | Na et al. |
| 2016/0302331 A1 | 10/2016 | Dunn |
| 2017/0023823 A1 | 1/2017 | Dunn et al. |
| 2017/0068042 A1 | 3/2017 | Dunn et al. |
| 2017/0074453 A1 | 3/2017 | Bowers et al. |
| 2017/0083043 A1 | 3/2017 | Bowers et al. |
| 2017/0083062 A1 | 3/2017 | Bowers et al. |
| 2017/0111486 A1 | 4/2017 | Bowers et al. |
| 2017/0111520 A1 | 4/2017 | Bowers et al. |
| 2017/0111521 A1 | 4/2017 | Bowers et al. |
| 2017/0127579 A1 | 5/2017 | Hubbard |
| 2017/0140344 A1 | 5/2017 | Bowers et al. |
| 2017/0147992 A1 | 5/2017 | Bowers et al. |
| 2017/0163519 A1 | 6/2017 | Bowers et al. |
| 2017/0172016 A1 | 6/2017 | Kang |
| 2017/0175411 A1 | 6/2017 | Bowers et al. |
| 2017/0188490 A1 | 6/2017 | Dunn et al. |
| 2017/0231112 A1 | 8/2017 | Dunn et al. |
| 2017/0245400 A1 | 8/2017 | Dunn et al. |
| 2017/0257978 A1 | 9/2017 | Diaz |
| 2017/0332523 A1 | 11/2017 | DeMars |
| 2017/0345346 A1 | 11/2017 | Hong et al. |
| 2018/0020579 A1 | 1/2018 | Chang et al. |
| 2018/0042134 A1 | 2/2018 | Dunn et al. |
| 2018/0088368 A1 | 3/2018 | Notoshi et al. |
| 2018/0088398 A1 | 3/2018 | Lee et al. |
| 2018/0116073 A1 | 4/2018 | Dunn |
| 2018/0199450 A1 | 7/2018 | Kim et al. |
| 2018/0259806 A1 | 9/2018 | Oh et al. |
| 2018/0263142 A1 | 9/2018 | Oh et al. |
| 2018/0310439 A1 | 10/2018 | Oh et al. |
| 2018/0314103 A1 | 11/2018 | Dunn et al. |
| 2018/0315356 A1 | 11/2018 | Dunn et al. |
| 2018/0317330 A1 | 11/2018 | Dunn et al. |
| 2018/0317350 A1 | 11/2018 | Dunn et al. |
| 2018/0364519 A1 | 12/2018 | Dunn et al. |
| 2019/0021189 A1 | 1/2019 | Kim et al. |
| 2019/0037738 A1 | 1/2019 | Dunn et al. |
| 2019/0089176 A1 | 3/2019 | Dunn et al. |
| 2019/0133002 A1 | 5/2019 | Dunn et al. |
| 2019/0159363 A1 | 5/2019 | Jang et al. |
| 2019/0208674 A1 | 7/2019 | Demars |
| 2019/0239365 A1 | 8/2019 | Dunn et al. |
| 2019/0289754 A1 | 9/2019 | Hubbard |
| 2019/0327865 A1 | 10/2019 | Dunn et al. |
| 2020/0096797 A1 | 3/2020 | Teragawa |
| 2020/0154597 A1 | 5/2020 | Dunn et al. |
| 2020/0163235 A1 | 5/2020 | Dunn |
| 2020/0201402 A1 | 6/2020 | Lee et al. |
| 2020/0205303 A1 | 6/2020 | Dunn et al. |
| 2020/0241612 A1 | 7/2020 | Moon et al. |
| 2020/0253095 A1 | 8/2020 | Dunn et al. |
| 2020/0275585 A1 | 8/2020 | Dunn |
| 2020/0288585 A1 | 9/2020 | Dunn et al. |
| 2020/0319676 A1 | 10/2020 | Dunn |
| 2020/0352049 A1 | 11/2020 | Dunn et al. |
| 2020/0367391 A1 | 11/2020 | Dunn |
| 2020/0369169 A1 | 11/2020 | Mercer et al. |
| 2020/0387194 A1 | 12/2020 | Dunn |
| 2020/0390009 A1 | 12/2020 | Whitehead et al. |
| 2021/0007241 A1 | 1/2021 | Diaz |
| 2021/0022273 A1 | 1/2021 | Hubbard |
| 2021/0165472 A1 | 6/2021 | Chin |
| 2021/0168949 A1 | 6/2021 | Dunn et al. |
| 2021/0231998 A1 | 7/2021 | Noso et al. |
| 2021/0243906 A1 | 8/2021 | Dunn |
| 2021/0243914 A1 | 8/2021 | Dunn |
| 2021/0304644 A1 | 9/2021 | Webster |
| 2021/0307214 A1 | 9/2021 | Zhang et al. |
| 2021/0345528 A1 | 11/2021 | Dunn |
| 2021/0400853 A1 | 12/2021 | Choi |
| 2021/0408676 A1 | 12/2021 | Sainz Fuertes |
| 2022/0035198 A1 | 2/2022 | Dunn et al. |
| 2022/0110227 A1 | 4/2022 | Brown |
| 2022/0121255 A1 | 4/2022 | Wang et al. |
| 2022/0132707 A1 | 4/2022 | Dunn et al. |
| 2022/0287200 A1 | 9/2022 | Dunn et al. |
| 2022/0394861 A1 | 12/2022 | Dunn et al. |
| 2022/0408616 A1 | 12/2022 | Brown |
| 2022/0408617 A1 | 12/2022 | Brown |
| 2023/0030742 A1 | 2/2023 | Dunn et al. |
| 2023/0032626 A1 | 2/2023 | Brown |
| 2023/0033017 A1 | 2/2023 | Dunn |
| 2023/0036767 A1 | 2/2023 | Dunn et al. |
| 2023/0056061 A1 | 2/2023 | Dunn et al. |
| 2023/0059819 A1 | 2/2023 | Dunn et al. |
| 2023/0160774 A1 | 5/2023 | Dunn et al. |
| 2023/0164964 A1 | 5/2023 | Dunn et al. |
| 2023/0200031 A1 | 6/2023 | Dunn |
| 2023/0209786 A1 | 6/2023 | Dunn |
| 2023/0345683 A1 | 10/2023 | Dunn et al. |
| 2023/0359077 A1 | 11/2023 | Dunn et al. |
| 2023/0422431 A1 | 12/2023 | Dunn et al. |
| 2023/0422453 A1 | 12/2023 | Dunn |
| 2024/0032238 A1 | 1/2024 | Dunn et al. |
| 2024/0114633 A1 | 4/2024 | Dunn |

FOREIGN PATENT DOCUMENTS

| | | |
|---|---|---|
| AU | 2015253128 B2 | 3/2018 |
| AU | 2017216500 B2 | 10/2018 |
| AU | 2015229457 B2 | 3/2019 |
| AU | 2016220308 B2 | 3/2019 |
| AU | 2017228430 B2 | 3/2020 |
| AU | 2018258497 B2 | 1/2021 |
| AU | 2018257648 B2 | 2/2021 |
| BR | PI0820231-1 | 2/2019 |
| CA | 2705814 C | 2/2018 |
| CA | 2947524 C | 4/2018 |
| CA | 2915261 C | 8/2018 |
| CA | 2798277 C | 6/2019 |
| CA | 2809019 C | 9/2019 |
| CA | 2888494 C | 9/2019 |
| CA | 2976116 C | 11/2020 |
| CA | 3015365 C | 8/2021 |
| CA | 3059972 C | 1/2022 |
| CA | 2942321 C | 6/2022 |
| CA | 3059928 C | 11/2022 |
| CN | 2702363 Y | 5/2005 |
| CN | 201228893 Y | 4/2009 |
| CN | 202838830 U | 3/2013 |
| CN | 106304788 A | 1/2017 |
| CN | 107251671 A | 10/2017 |
| CN | 108700739 A | 10/2018 |
| CN | 107251671 B | 8/2019 |
| CN | 216697703 U | 6/2022 |
| EP | 1408476 A1 | 4/2004 |
| EP | 1647766 A2 | 4/2006 |
| EP | 1722559 A1 | 11/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2587175 A1 | 5/2013 |
| EP | 2603831 A2 | 6/2013 |
| EP | 2801888 A2 | 11/2014 |
| EP | 2909829 A1 | 8/2015 |
| EP | 3020260 A2 | 5/2016 |
| EP | 3040766 A1 | 7/2016 |
| EP | 3117693 A2 | 1/2017 |
| EP | 3259968 A1 | 12/2017 |
| EP | 3423886 A | 1/2019 |
| EP | 3468321 A1 | 4/2019 |
| EP | 3138372 B1 | 5/2019 |
| EP | 3117693 B1 | 8/2019 |
| EP | 2567283 B1 | 10/2019 |

(56) References Cited

FOREIGN PATENT DOCUMENTS

| | | |
|---|---|---|
| EP | 2909829 B1 | 2/2020 |
| EP | 3615978 A1 | 3/2020 |
| EP | 3616481 A1 | 3/2020 |
| EP | 3624574 A1 | 3/2020 |
| EP | 3468321 B1 | 4/2021 |
| EP | 3423886 B1 | 2/2022 |
| EP | 3259968 B1 | 4/2022 |
| EP | 4232870 A1 | 8/2023 |
| EP | 3615978 B1 | 1/2024 |
| FR | 2893752 A1 | 5/2007 |
| GB | 2402205 A | 12/2004 |
| JP | 402062015 A | 3/1990 |
| JP | 402307080 A | 12/1990 |
| JP | 3153212 A | 7/1991 |
| JP | H497194 A | 3/1992 |
| JP | H06-2337 U | 1/1994 |
| JP | 6082745 A | 3/1994 |
| JP | H8-54834 A | 2/1996 |
| JP | H8-55567 A | 2/1996 |
| JP | 8115788 A | 5/1996 |
| JP | H8-152604 A | 6/1996 |
| JP | 8194437 A | 7/1996 |
| JP | H08-305301 A | 11/1996 |
| JP | 8339034 A | 12/1996 |
| JP | H9-160512 A | 6/1997 |
| JP | H09246766 A | 9/1997 |
| JP | H10152604 A | 6/1998 |
| JP | H-10222076 A | 8/1998 |
| JP | H11-68363 A | 3/1999 |
| JP | 11160727 A | 6/1999 |
| JP | H-11233967 A | 8/1999 |
| JP | H11296094 A | 10/1999 |
| JP | 2000-10501 A | 1/2000 |
| JP | 2000112033 A | 4/2000 |
| JP | 2000131682 A | 5/2000 |
| JP | 3118907 B2 | 10/2000 |
| JP | 2001209125 A | 8/2001 |
| JP | 2001209126 A | 8/2001 |
| JP | 2001326488 A | 11/2001 |
| JP | 2002-6282 A | 1/2002 |
| JP | 2002006757 A | 1/2002 |
| JP | 2002148714 A | 5/2002 |
| JP | 2002158475 A | 5/2002 |
| JP | 2003036032 A | 2/2003 |
| JP | 2003-76286 A | 3/2003 |
| JP | 2003-162228 A | 6/2003 |
| JP | 2003173147 A | 6/2003 |
| JP | 2004053749 A | 2/2004 |
| JP | 2004-199675 A | 7/2004 |
| JP | 2004193002 A | 7/2004 |
| JP | 2004285940 A | 10/2004 |
| JP | 2004286940 A | 10/2004 |
| JP | 2005017434 A | 1/2005 |
| JP | 2005017556 A | 1/2005 |
| JP | 2005134849 A | 5/2005 |
| JP | 2005181799 A | 7/2005 |
| JP | 2005265922 A | 9/2005 |
| JP | 2005292939 A | 10/2005 |
| JP | 2005332253 A | 12/2005 |
| JP | 2006010851 A | 1/2006 |
| JP | 2006-32890 A | 2/2006 |
| JP | 2006513577 A | 4/2006 |
| JP | 2006148047 A | 6/2006 |
| JP | 2006163217 A | 6/2006 |
| JP | 2006-176112 A | 7/2006 |
| JP | 2006198344 A | 8/2006 |
| JP | 2006293062 A | 10/2006 |
| JP | 2006317494 A | 11/2006 |
| JP | 2006-330196 A | 12/2006 |
| JP | 2007003638 A | 1/2007 |
| JP | 2007052951 A | 3/2007 |
| JP | 2007207595 A | 8/2007 |
| JP | 2007-293105 A | 11/2007 |
| JP | 09307257 A | 11/2007 |
| JP | 2007322718 A | 12/2007 |
| JP | 2008010361 A | 1/2008 |
| JP | 2008292743 A | 12/2008 |
| JP | 2010024624 A | 2/2010 |
| JP | 2010083311 A | 4/2010 |
| JP | 2010-102227 A | 5/2010 |
| JP | 2010-282109 A | 12/2010 |
| JP | 2011-14593 A | 1/2011 |
| JP | 2011-503663 A | 1/2011 |
| JP | 2011-75819 A | 4/2011 |
| JP | 2012-118130 A | 6/2012 |
| JP | 2012-133254 A | 7/2012 |
| JP | 2013-537721 A | 10/2013 |
| JP | 2014-225595 A | 12/2014 |
| JP | 6039450 B2 | 12/2016 |
| JP | 2017518526 A | 7/2017 |
| JP | 2018-511838 A | 4/2018 |
| JP | 6305564 B2 | 4/2018 |
| JP | 2019-512721 A | 5/2019 |
| JP | 6526245 B2 | 5/2019 |
| JP | 6688402 B2 | 4/2020 |
| JP | 6824440 B2 | 1/2021 |
| JP | 6858276 B2 | 3/2021 |
| KR | 20000000118 U | 1/2000 |
| KR | 200163508 Y1 | 7/2000 |
| KR | 20000047899 A | 7/2000 |
| KR | 200206768 Y1 | 12/2000 |
| KR | 20010044073 A | 6/2001 |
| KR | 200236278 Y1 | 10/2001 |
| KR | 10-2067751 B1 | 1/2002 |
| KR | 200286961 Y1 | 8/2002 |
| KR | 100673470 B1 | 1/2004 |
| KR | 1020040067701 A | 7/2004 |
| KR | 200366674 Y1 | 11/2004 |
| KR | 20050033986 A | 4/2005 |
| KR | 20050036254 A | 4/2005 |
| KR | 200401354 Y1 | 11/2005 |
| KR | 20060016469 A | 2/2006 |
| KR | 10-0563049 B1 | 3/2006 |
| KR | 20060054742 A | 5/2006 |
| KR | 10-2006-0070176 A | 6/2006 |
| KR | 20060091898 A | 8/2006 |
| KR | 20060120904 A | 11/2006 |
| KR | 100659339 B1 | 12/2006 |
| KR | 100666961 B1 | 1/2007 |
| KR | 20070002494 A | 1/2007 |
| KR | 1020070070675 A | 4/2007 |
| KR | 10-2007-0048300 A | 5/2007 |
| KR | 20070048296 A | 5/2007 |
| KR | 1020070048294 | 8/2007 |
| KR | 20080005024 A | 1/2008 |
| KR | 20080010091 A | 1/2008 |
| KR | 20080018486 A | 2/2008 |
| KR | 20080047241 A | 5/2008 |
| KR | 20090116368 A | 11/2009 |
| KR | 10-1153923 B1 | 6/2012 |
| KR | 10-2013-0126034 A | 11/2013 |
| KR | 101764381 B1 | 7/2017 |
| KR | 10-1847151 B1 | 4/2018 |
| KR | 10-1853885 B1 | 4/2018 |
| KR | 10-1868077 B1 | 6/2018 |
| KR | 10-1885884 B1 | 7/2018 |
| KR | 10-1894027 B1 | 8/2018 |
| KR | 10-1904363 B1 | 9/2018 |
| KR | 10-1958375 B1 | 3/2019 |
| KR | 10-2010515 B1 | 8/2019 |
| KR | 10-2063885 | 1/2020 |
| KR | 10-2104342 B1 | 4/2020 |
| KR | 10-2109072 B1 | 5/2020 |
| KR | 10-2165778 B1 | 10/2020 |
| KR | 10-2262912 B1 | 6/2021 |
| KR | 10-2267374 B1 | 6/2021 |
| KR | 10-2306650 B1 | 9/2021 |
| KR | 10-2379046 B1 | 3/2022 |
| KR | 10-2400990 B1 | 5/2022 |
| KR | 10-2501211 B1 | 2/2023 |
| RU | 2513043 C2 | 4/2014 |
| WO | WO2005079129 A1 | 8/2005 |
| WO | WO2007/116117 A1 | 10/2007 |
| WO | WO2007116116 A1 | 10/2007 |

(56) References Cited

FOREIGN PATENT DOCUMENTS

| | | |
|---|---|---|
| WO | WO2008050660 A2 | 5/2008 |
| WO | WO2008085138 A | 7/2008 |
| WO | WO2008/102050 A1 | 8/2008 |
| WO | WO2009/047390 A1 | 4/2009 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |
| WO | WO2011069084 A3 | 6/2011 |
| WO | WO2011072217 A3 | 6/2011 |
| WO | WO2011140179 A2 | 11/2011 |
| WO | WO2011150078 A2 | 12/2011 |
| WO | WO2012021573 A2 | 2/2012 |
| WO | WO2012024426 A3 | 2/2012 |
| WO | WO2013/182733 A1 | 12/2013 |
| WO | WO2014062815 A1 | 4/2014 |
| WO | WO2014149773 A1 | 9/2014 |
| WO | WO2014150036 A1 | 9/2014 |
| WO | WO2015/138609 A2 | 9/2015 |
| WO | WO2015168375 A1 | 11/2015 |
| WO | WO2016/102980 A1 | 6/2016 |
| WO | WO2016102982 A1 | 6/2016 |
| WO | WO2016127613 A1 | 8/2016 |
| WO | WO2016133852 A1 | 8/2016 |
| WO | WO2017152166 A1 | 9/2017 |
| WO | WO2018/200260 A1 | 11/2018 |
| WO | WO2018/200905 A1 | 11/2018 |
| WO | WO2020/081687 A1 | 4/2020 |
| WO | WO2020/205305 A1 | 10/2020 |
| WO | WO2022/087488 A1 | 4/2022 |
| WO | WO2023/096738 A1 | 6/2023 |
| WO | WO2024/020185 A1 | 1/2024 |

OTHER PUBLICATIONS

*Samsung Electronics Co., Ltd and Samsung Electronics America, Inc.* v *Manufacturing Resources International, Inc.*, Final Written Decision IPR2023-00220, Jul. 3, 2024, 78 pages.
*Samsung Electronics Co., Ltd and Samsung Electronics America, Inc.* v *Manufacturing Resources International, Inc.*, Final Written Decision IPR2023-00254, Jul. 3, 2024, 114 pages.
*Samsung Electronics Co., Ltd and Samsung Electronics America, Inc.* v *Manufacturing Resources International, Inc.*, Final Written Decision IPR2023-00221, Jul. 3, 2024, 116 pages.
Mentley, David E., State of Flat-Panel Display Technology and Future Trends, Proceedings of the IEEE, Apr. 2002, vol. 90, No. 4, pp. 453-459.
Rohsenow, Warren M., Handbook of Heat Transfer, Third Edition, 1998, select chapters, 112 pages, McGraw-Hill.
The American Heritage College Dictionary, Third Edition, 1993, excerpt, 3 pages, Houghton Mifflin Company.
*Civiq Smartscapes LLC.* V *Manufacturing Resources International, Inc.*, Petition for Inter Partes Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.
*Civiq Smartscapes LLC.* V *Manufacturing Resources International, Inc.*, Defendant's Amended Answer and Countercliams to Plaintiff's First Amended Complaint, Filed Apr. 24, 2018, 240 pages.
*Civiq Smartscapes, LLC* V. *Manufacturing Resources International, Inc.*, Memorandum Order re "rear surface of the electronic display" term construction, Mar. 5, 2019, 3 pages.
United States International Trade Commission, *Manufacturing Resources International, Inc.* v *Samsung Electronics Co.*, Ltd et al., In the Matter of Certain Outdoor and Semioutdoor Electronic Displays, Products Containing Same, and Components Thereof, Inv. No. 337-TA-1331, Final Initial Determination of Violation of Section 337, Public Version, Nov. 13, 2023, 325 pages.
Declaration of Robert Smith Gillespie, Certain Outdoor and Semi-outdoor Electronic Displays, Products, Containing same, and Components thereof, Jan. 17, 2023, 42 pages.
*Samsung Electronics Co., Ltd and Samsung Electronics America, Inc.* v *Manufacturing Resources International, Inc.*, Declaration of Michael Gershowitz, Sep. 26, 2023, 77 pages.
*Samsung Electronics Co., Ltd and Samsung Electronics America, Inc.* v *Manufacturing Resources International, Inc.*, Expert Declaration of Dr. Himanshu Pokhama,, Sep. 26, 2023, 104 pages.
*Samsung Electronics Co., Ltd and Samsung Electronics America, Inc.* v *Manufacturing Resources International, Inc.*, Decision to Institute IPR2023-00199, Jun. 20, 2023, 53 pages.
*Samsung Electronics Co., Ltd and Samsung Electronics America, Inc.* v *Manufacturing Resources International, Inc.*, Decision to Institute IPR2023-00220, Jun. 20, 2023, 51 pages.
*Samsung Electronics Co., Ltd and Samsung Electronics America, Inc.* v *Manufacturing Resources International, Inc.*, Decision to Institute IPR2023-00221, Jun. 20, 2023, 80 pages.
*Samsung Electronics Co., Ltd and Samsung Electronics America, Inc.* v *Manufacturing Resources International, Inc.*, Decision to Institute IPR2023-00254, Jun. 20, 2023, 72 pages.
*Samsung Electronics Co., Ltd and Samsung Electronics America, Inc.* v *Manufacturing Resources International, Inc.*, Decision to Institute IPR2023-00255, Jul. 18, 2023, 47 pages.
*Samsung Electronics Co., Ltd. and Samsung Electronics America, Inc.* v *Manufacturing Resources International, Inc.*, Final Written Decision IPR2023-00255, Jul. 30, 2024, 94 pages.
Itsenclosures, Product Catalog, 2009, 48 pages.
Itsenclosures, Standard Product Data Sheet, 2011, 18 pages.
Sunbritetv, All Weather Outdoor LCD Television Model 4610HD, 2008, 1 page.
Sunbritetv, Introduces Two New All-Weather Outdoor Televisions InfoComm 2008, 7 pages.
Itsenclosures, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., EMC analysis of an 18"LCD monitor, 2000, 1 page.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017,14 pages.
Adnation, Turn Key Advertising Technology Solutions, May 23, 2017, 4 pages.
Civiq Smartscapes, FlexVue Ferro 55P/55L, Mar. 16, 2017, 4 pages.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
Civiq, Invalidity Claim Charts, Appendix A—Appendix D, Jan. 24, 2018, 51 pages.
Civiq, Invalidity Contentions, Jan. 24, 2018, 51 pages.
Scott, Cooling of Electronic Equipment, Apr. 4, 1974, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
Civiq, Invalidity Claim Chart, Appendix I, Mar. 22, 2018, 4 pages.
Civiq, Invalidity Claim Charts, Appendix F to H, Mar. 22, 2018, 18 pages.
Yung, Using Metal Core Printed Circuit Board as a Solution for Thermal Management article, 2007, 5 pages.
*Civiq Smartscapes, LLC* V. *Manufacturing Resources International, Inc.*, Memorandum Opinion re claim construction, Sep. 27, 2018, 16 pages.
*Civiq Smartscapes, LLC* V. *Manufacturing Resources International, Inc.*, Claim Construction Order, Oct. 3, 2018, 2 pages.
Anandan, Munismay, Progress of LED backlights for LCDs, Journal of the SID, 2008, pp. 287-310, 16/2.

(56) References Cited

OTHER PUBLICATIONS

Melford Technologies, Part 2, video online at https://m.youtube.com/watch?v=znlyHWozwDA, Oct. 21, 2019, 1 page.

* cited by examiner

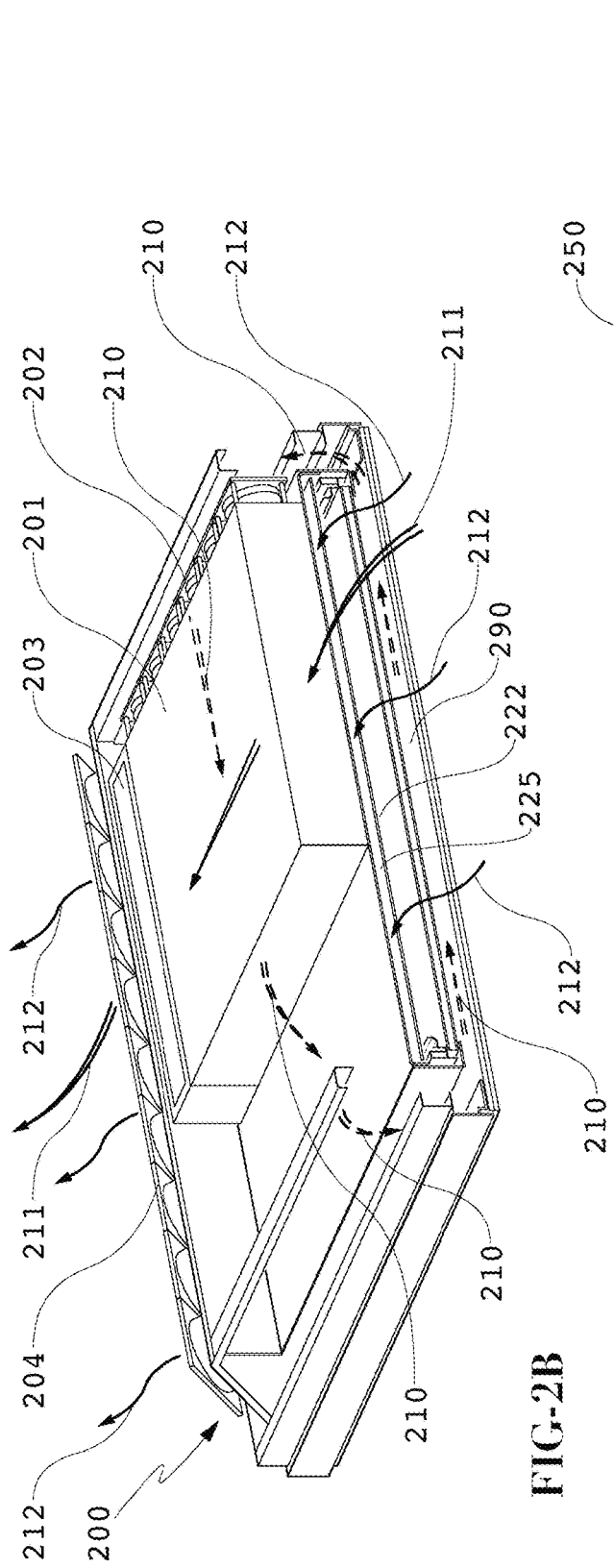
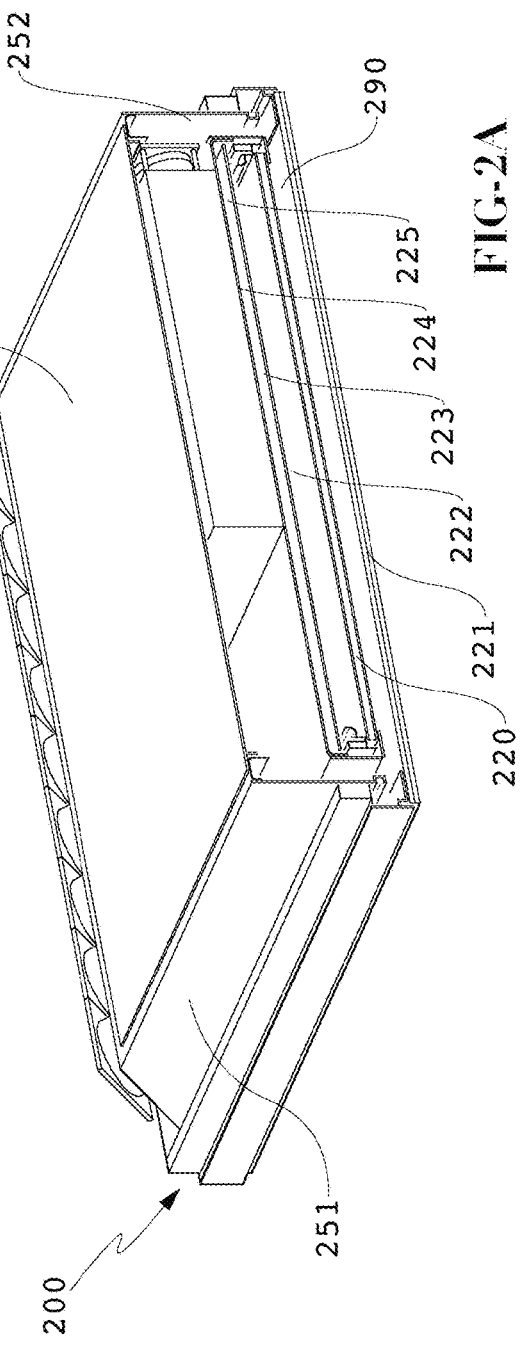

ELECTRONIC DISPLAY WITH COOLING

CROSS-REFERENCE TO RELATED APPLICATIONS

This application is a continuation of U.S. application Ser. No. 18/243,407 filed on Sep. 7, 2023; U.S. application Ser. No. 18/243,407 is a continuation of U.S. application Ser. No. 17/967,607 filed on Oct. 17, 2022; U.S. application Ser. No. 17/967,607 is a continuation of U.S. application Ser. No. 17/751,263 filed on May 23, 2022, now U.S. Pat. No. 11,540,418 issued on Dec. 27, 2022; U.S. application Ser. No. 17/751,263 is a continuation of U.S. application Ser. No. 17/234,237 filed on Apr. 19, 2021, now U.S. Pat. No. 11,596,081 issued on Feb. 28, 2023; U.S. application Ser. No. 17/234,237 is a continuation of U.S. application Ser. No. 16/933,932 filed on Jul. 20, 2020, now U.S. Pat. No. 11,013,142 issued on May 18, 2021; U.S. application Ser. No. 16/933,932 is a continuation of U.S. application Ser. No. 16/708,260 filed on Dec. 9, 2019, now U.S. Pat. No. 10,721,836 issued on Jul. 21, 2020; U.S. application Ser. No. 16/708,260 is a continuation of U.S. application Ser. No. 15/789,331 filed on Oct. 20, 2017, now U.S. Pat. No. 10,506,740 issued on Dec. 10, 2019; U.S. application Ser. No. 15/789,331 is a continuation of U.S. application Ser. No. 14/834,034 filed on Aug. 24, 2015, now U.S. Pat. No. 9,801,305 issued on Oct. 24, 2017; U.S. application Ser. No. 14/834,034 is a continuation of U.S. application Ser. No. 14/050,464 filed on Oct. 10, 2013, now U.S. Pat. No. 9,119,325 issued on Aug. 25, 2015; U.S. application Ser. No. 14/050,464 is a continuation of U.S. application Ser. No. 12/641,468 filed on Dec. 18, 2009, now U.S. Pat. No. 8,654,302 issued on Feb. 18, 2014, which is a non-provisional of U.S. Application No. 61/138,736 filed on Dec. 18, 2008; U.S. application Ser. No. 12/641,468 is a continuation-in-part of U.S. application Ser. No. 12/411,925 filed on Mar. 26, 2009, now U.S. Pat. No. 8,854,595 issued on Oct. 7, 2014, which is a non-provisional application of U.S. Application No. 61/039,454 filed on Mar. 26, 2008; U.S. application Ser. No. 12/641,468 is a continuation-in-part of U.S. application Ser. No. 12/556,029 filed on Sep. 9, 2009, now U.S. Pat. No. 8,373,841 issued on Feb. 12, 2013, which is a non-provisional application of U.S. Application No. 61/095,615 filed on Sep. 9, 2008; U.S. application Ser. No. 12/641,468 is a continuation-in-part of U.S. application Ser. No. 12/234,307 filed on Sep. 19, 2008, now U.S. Pat. No. 8,767,165 issued on Jul. 1, 2014, which is a non-provisional application of U.S. Application No. 61/033,064 filed on Mar. 3, 2008; U.S. application Ser. No. 12/641,468 is a continuation-in-part of U.S. application Ser. No. 12/234,360 filed on Sep. 19, 2008, which is a non-provisional application of U.S. Application No. 61/053,713 filed on May 16, 2008; U.S. application Ser. No. 12/641,468 is a continuation-in-part of U.S. application Ser. No. 12/237,365 filed on Sep. 24, 2008, now U.S. Pat. No. 8,879,042 issued on Nov. 4, 2014, which is a non-provisional application of U.S. Application No. 61/057,599 filed on May 30, 2008; U.S. application Ser. No. 12/641,468 is a continuation-in-part of U.S. application Ser. No. 12/235,200 filed on Sep. 22, 2008, which is a non-provisional of U.S. Application No. 61/076,126 filed on Jun. 26, 2008; U.S. application Ser. No. 12/641,468 is a continuation-in-part of U.S. application Ser. No. 12/620,330 filed on Nov. 17, 2009, now U.S. Pat. No. 8,274,622 issued on Sep. 25, 2012, which is a non-provisional of U.S. Application No. 61/115,333 filed on Nov. 17, 2008; U.S. application Ser. No. 12/641,468 is a continuation-in-part of U.S. application Ser. No. 12/556,209 filed on Sep. 9, 2009, now U.S. Pat. No. 8,379,182 issued on Feb. 19, 2013, which is a non-provisional of U.S. provisional application No. 61/095,616 filed on Sep. 9, 2008; all of said aforementioned applications are hereby incorporated by reference in their entirety as if fully recited herein.

TECHNICAL FIELD

The exemplary embodiments described herein generally relate to cooling systems and in particular to cooling systems for electronic displays.

BACKGROUND

Conductive and convective heat transfer systems for electronic displays generally attempt to remove heat from the electronic components in a display through the sidewalls of the display. In order to do this, the systems of the past have relied primarily on fans for moving internal air (or ingested ambient air) within the housing past the components to be cooled and out of the display. These components are typically power supplies. In some cases, the heated air is moved into convectively thermal communication with fins.

While such heat transfer systems have enjoyed a measure of success in the past, improvements to displays and new display applications require even greater cooling capabilities. Electronic displays are now being used in outdoor environments and other applications where they may be exposed to high ambient temperatures and even direct sunlight. In particular, cooling devices for electronic displays of the past have generally used convective heat dissipation systems that function to cool only the rear interior portion of the display. By itself, this is not adequate in many climates, especially when radiative heat transfer from the sun through a display window becomes a major factor. In many applications and locations 200 Watts or more of power through such a display window is common. Furthermore, the market is demanding larger screen sizes for displays. With increased electronic display screen size and corresponding display window size more heat will be generated and more heat will be transmitted into the displays. Also, when displays are used in outdoor environments the ambient air may contain contaminates (dust, dirt, pollen, water vapor, smoke, etc.) which, if ingested into the display for cooling the interior can cause damage to the interior components of the display.

A large fluctuation in temperature is common in the devices of the past. Such temperature fluctuation adversely affects the electronic components in these devices; both performance and lifetime may be severely affected. Thus, there exists a need for a cooling system for electronic displays which are placed within environments having high ambient temperatures, possibly contaminates present within the ambient air, and even placed in direct sunlight.

SUMMARY

Exemplary embodiments may comprise two separate flow paths for gas through an electronic display. A first flow path may be a closed loop and a second flow path may be an open loop. The closed loop path travels across the front surface of the image assembly, continues to the rear of the display where it may enter a heat exchanger, finally returning to the front surface of the image assembly. The open loop path may draw ambient gas (ex. ambient air) through the rear of the display (sometimes through a heat exchanger, behind an image assembly, or both) and then exhausts it out of the display housing. A heat exchanger may be used to transfer heat from the circulating gas to the ambient gas. In alternative embodiments, the ambient gas may also be forced behind the image assembly (sometimes a backlight), in order to cool the image assembly and/or backlight assembly (if a backlight is necessary for the particular type of display being used). A cross-flow heat exchanger may be used in an exemplary embodiment.

The foregoing and other features and advantages of the exemplary embodiments will be apparent from the following more detailed description of the particular embodiments of the invention, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which:

FIG. 2A is a perspective section view of another embodiment showing the closed loop and open loop channels.

FIG. 2B is a perspective section view similar to the view shown in FIG. 2A where the rear and side covers have been removed.

DETAILED DESCRIPTION OF THE EXEMPLARY EMBODIMENTS

Figure 1:
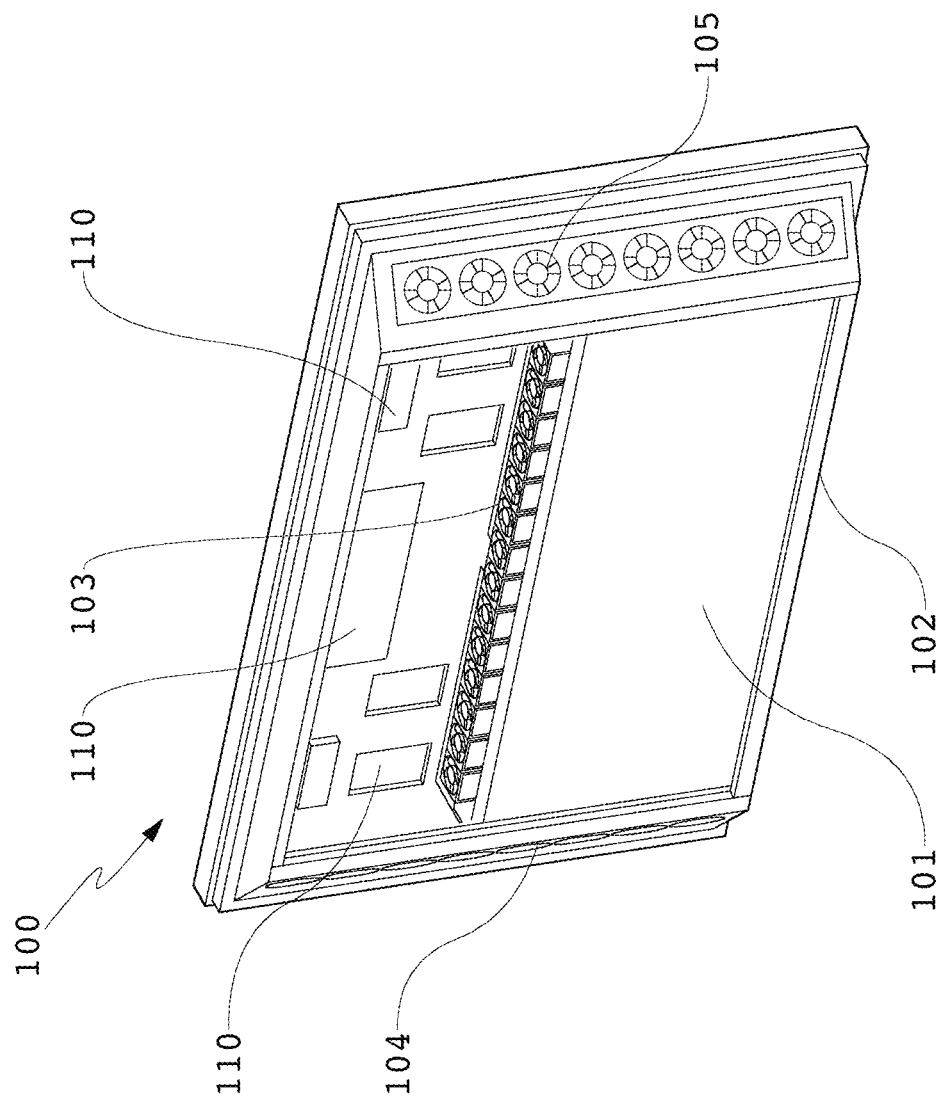
FIG. 1 is a rear perspective view of an embodiment where the rear cover of the display has been removed.

FIG. 1 shows the rear of an embodiment for an electronic display 100, where the rear cover for the display housing has been removed in order to show the internal components. In this embodiment, the fan assemblies 102 and 103 for the closed loop may be placed along two opposing edges of a heat exchanger 101. Preferably, fan assembly 102 is the inlet for the heat exchanger and fan assembly 103 is the exit for the heat exchanger 101. These assemblies can optionally be reversed however, where fan assembly 103 is the inlet and fan assembly 102 is the exit. Further, both assemblies 102 and 103 are not required. Some embodiments may use only one fan assembly for the closed loop. If only one fan assembly is used, it may be preferable to place the fan assembly at the inlet of the heat exchanger 101, so that the circulating gas is 'pulled' across the front of the image assembly and pushed through the heat exchanger 101. This is not required however; other embodiments may pull the isolated gas through the heat exchanger 101. Other embodiments may push the isolated gas across the front of the image assembly. Fan assemblies 104 and 105 for the open loop may be placed along two opposing edges of the display housing. Again, both assemblies 104 and 105 are not required as some embodiments may use only one assembly and may use the open loop fan assemblies in a push or pull design. Because the various fan assemblies described herein can be placed in multiple orientations, when referring to the placement of the various fan assemblies, the terms 'push', 'pull', 'force', and 'draw' will be used interchangeably and any orientation may be used with the various embodiments herein.

The circulating gas which is being forced by the closed loop fan assemblies is primarily circulating around the display. For example, the gas travels in a loop where it passes through a channel, contacting the front surface of the image assembly (see FIGS. 2A-2B) and absorbs heat from the image assembly. The circulating gas is then preferably directed (or forced) into the heat exchanger 101 in order to transfer heat from the circulating gas to the ambient gas. Afterwards, the circulating gas exits the heat exchanger 101 and may eventually return to the channel and contact the front surface of the image assembly. The circulating gas may also pass over several electronic components 110 in order to extract heat from these devices as well. The electronic components 110 may be any components or assemblies used to operate the display including, but not limited to: transformers, circuit boards, resistors, capacitors, batteries, power modules, motors, inductors, illumination devices, wiring and wiring harnesses, lights, thermo-electric devices, and switches. In some embodiments, the electrical components 110 may also include heaters, when the display assembly might be used in cold-weather environments.

In order to cool the circulating gas (as well as optionally cooling a backlight assembly or image assembly) ambient gas is ingested into the display housing by the open loop fan assembly 104 and/or 105. The ambient gas may simply be ambient air which is surrounding the display. In some embodiments, the ambient gas may be air conditioned (or otherwise cooled) prior to being drawn into the display. Once the ambient gas is ingested into the display, it may be directed (or forced) through the heat exchanger 101 and optionally also across the rear surface of the backlight assembly or image assembly (see FIGS. 2A-2B). By using the heat exchanger 101, heat may be transferred from the circulating gas to the ambient gas. The heated ambient gas may then be expelled out of the display housing.

Although not required, it is preferable that the circulating gas and ambient gas do not mix. This may prevent any contaminates and/or particulate that is present within the ambient gas from harming the interior of the display. In a preferred embodiment, the heat exchanger 101 would be a cross-flow heat exchanger. However, many types of heat exchangers are known and can be used with any of the embodiments herein. The heat exchanger 101 may be a cross-flow, parallel flow, or counter-flow heat exchanger. In an exemplary embodiment, the heat exchanger 101 would be comprised of a plurality of stacked layers of thin plates. The plates may have a corrugated, honeycomb, or tubular design, where a plurality of channels/pathways/tubes travel down the plate length-wise. The plates may be stacked such that the directions of the pathways are alternated with each adjacent plate, so that each plate's pathways are substantially perpendicular to the pathways of the adjacent plates. Thus, gas may enter the heat exchanger only through plates whose channels or pathways travel parallel to the path of the gas. Because the plates are alternated, the closed loop and ambient gases may travel in plates which are adjacent to one another and heat may be transferred between the two gases without mixing the gases themselves (if the heat exchanger is adequately sealed, which is preferable but not required).

In an alternative design, an open channel may be placed in between a pair of corrugated, honeycomb, or tubular plates. The open channel may travel in a direction which is perpendicular to the pathways of the adjacent plates. This open channel may be created by running two strips of material or tape (esp. very high bond (VHB) tape) between two opposite edges of the plates in a direction that is perpendicular to the direction of the pathways in the adjacent plates. Thus, gas entering the heat exchanger in a first direction may travel through the open channel (parallel to the strips or tape). Gas which is entering in a second direction (substantially perpendicular to the first direction) would travel through the pathways of the adjacent plates).

Other types of cross-flow heat exchangers could include a plurality of tubes which contain the first gas and travel perpendicular to the path of the second gas. As the second gas flows over the tubes containing the first gas, heat is exchanged between the two gases. Obviously, there are many types of cross-flow heat exchangers and any type would work with the embodiments herein.

An exemplary heat exchanger may have plates where the sidewalls have a relatively low thermal resistance so that heat can easily be exchanged between the two paths of gas. A number of materials can be used to create the heat exchanger. Preferably, the material used should be corrosion resistant, rot resistant, light weight, and inexpensive. Metals are typically used for heat exchangers because of their high thermal conductivity and would work with these embodiments. However, it has been discovered that plastics and composites can also satisfy the thermal conditions for electronic displays. An exemplary embodiment would utilize polypropylene as the material for constructing the plates for the heat exchanger. It has been found that although polypropylene may seem like a poor thermal conductor, the large amount of surface area relative to the small material thickness, results in an overall thermal resistance that is very low. Thus, an exemplary heat exchanger would be made of plastic and would thus produce a display assembly that is thin and lightweight. Specifically, corrugated plastic may be used for each plate layer.

As mentioned above, both inlet and exit fan assemblies are not required for the embodiments. Alternatively, only a single fan assembly may be used for each loop. Thus, only an inlet fan assembly may be used with the closed loop and only an exhaust fan assembly may be used with the open loop. Alternatively, one of the loops may have both inlet and exit fan assemblies while the other loop only has either an inlet or exit assembly.

The gas used in both loops can be any number of gaseous matters. In some embodiments, air may be used as the gas for both loops. Preferably, the gas which travels through the closed loop should be substantially clear, so that when it passes in front of the image assembly it will not affect the appearance of the image to a viewer. The gas which travels through the closed loop would also preferably be substantially free of contaminates and/or particulate (ex. dust, dirt, pollen, water vapor, smoke, etc.) in order to prevent an adverse effect on the image quality and damage to the internal electronic components. It may also be preferable to keep the gas within the open loop from having contaminates. An optional filter may be used to ensure that the air (either in the closed or open loop) stays free of contaminates. However, in an exemplary embodiment the open loop may be designed so that contaminates could possibly be present within the ambient gas but this will not harm the display. In these embodiments, the heat exchanger (and the optional path behind the image assembly or backlight) is properly sealed so that any contaminates in the ambient gas would not enter sensitive portions of the display. Thus, in these exemplary embodiments, ingesting ambient air for the ambient gas, even if the ambient air contains contaminates, will not harm the display. This can be particularly beneficial when the display is used in outdoor environments or indoor environments where contaminates are present in the ambient air.

FIG. 2A shows a cross-section of another embodiment of a display 200. In this figure, the rear cover 250 and side covers 251 and 252 are shown to illustrate one method for sealing the overall display 200. The image assembly 220 is shown near the front of the display 200. As discussed above, the image assembly 220 may comprise any form of electronic assembly for generating an image, including but not limited to: LCD, light emitting diode (LED), organic light emitting diode (OLED), field emitting displays (FED), light-emitting polymers (LEP), plasma displays, and any other flat/thin panel displays. The front display surface 221 is placed in front of the image assembly 220, defining a channel 290 through which the circulating gas may flow. The front display surface 221 may be any transparent material (glass, plastic, or composite) and may optionally comprise several layers for polarizing light, reducing glare or reflections, and protecting the internal display components. In an exemplary embodiment, the front display surface 221 would comprise two panes of glass which are laminated together with index-matching optical adhesive. Further, a polarizing layer may be attached to one of the panes of glass in order to reduce the internal reflections and solar loading on the image assembly 220. It is most preferable that the polarizing layer be attached to the inner surface of the front display surface 221 (the one facing the closed loop channel 290) and also contain an anti-reflective (AR) coating. The front display surface may be a durable display panel as disclosed in co-pending U.S. application Ser. No. 12/330,041 filed on Dec. 8, 2008, herein incorporated by reference in its entirety.

For the embodiment shown in FIG. 2A, the image assembly 220 may be an LCD stack with a backlight assembly 222. Some backlights may use cold cathode fluorescent lamps (CCFLs) to produce the illumination necessary for generating an image. In an exemplary embodiment, the backlight assembly 222 would comprise a printed circuit board (PCB) with a plurality of LEDs (light emitting diodes) on the front surface. An exemplary embodiment would have a low level of thermal resistance between the front surface of the backlight assembly 222 and the rear surface 223 of the backlight. A metallic PCB may be used for this purpose. The rear surface 223 of the backlight may contain a thermally conductive material, such as a metal. Aluminum may be an exemplary material for the rear surface 223. A second surface 224 may be placed behind the rear surface 223 of the backlight assembly 222. The space between the rear surface 223 of the backlight and the second surface 224 may define an additional optional open loop channel 225 through which ambient gas may travel in order to cool the backlight assembly 222 (or image assembly 220 if no backlight is used).

FIG. 2B shows the same cross section from FIG. 2A with the rear cover 250 and side covers 251 and 252 removed and the closed and open loop air flows shown for explanatory purposes. The closed loop fan assembly 202 may be used to propel the circulating gas 210 around the closed loop. A first open loop fan assembly 203 may be used to draw ambient gas 211 through the heat exchanger 201. Optionally, a second open loop fan assembly 204 may be used to draw ambient gas 212 through the additional optional channel 225 for cooling the backlight assembly 222 (or image assembly 220 if no backlight is used). The optional second open loop fan assembly 204 can also be used to exhaust ambient gas which has traveled through the heat exchanger 201 and through the channel 225. If a second open loop fan assembly 204 is not used (perhaps because the additional optional channel 225 is not used), the first open loop fan assembly 203 may be used to exhaust the ambient gas 211 that has traveled through the heat exchanger 201.

As noted above, in an exemplary embodiment the ambient gas 211 and 212 does not mix with the circulating gas 210. It may be important for the image quality that the circulating gas remains free of particulate and contaminates as this gas travels in front of the image assembly 220. Since gas for the open loop may contain various contaminates, a preferable embodiment should be adequately sealed to prevent the gas from the two loops from mixing. This is not necessary however, as filters (either removable or permanent) may be used to minimize the effect of particulate for both the open and closed loops.

Figure 3:
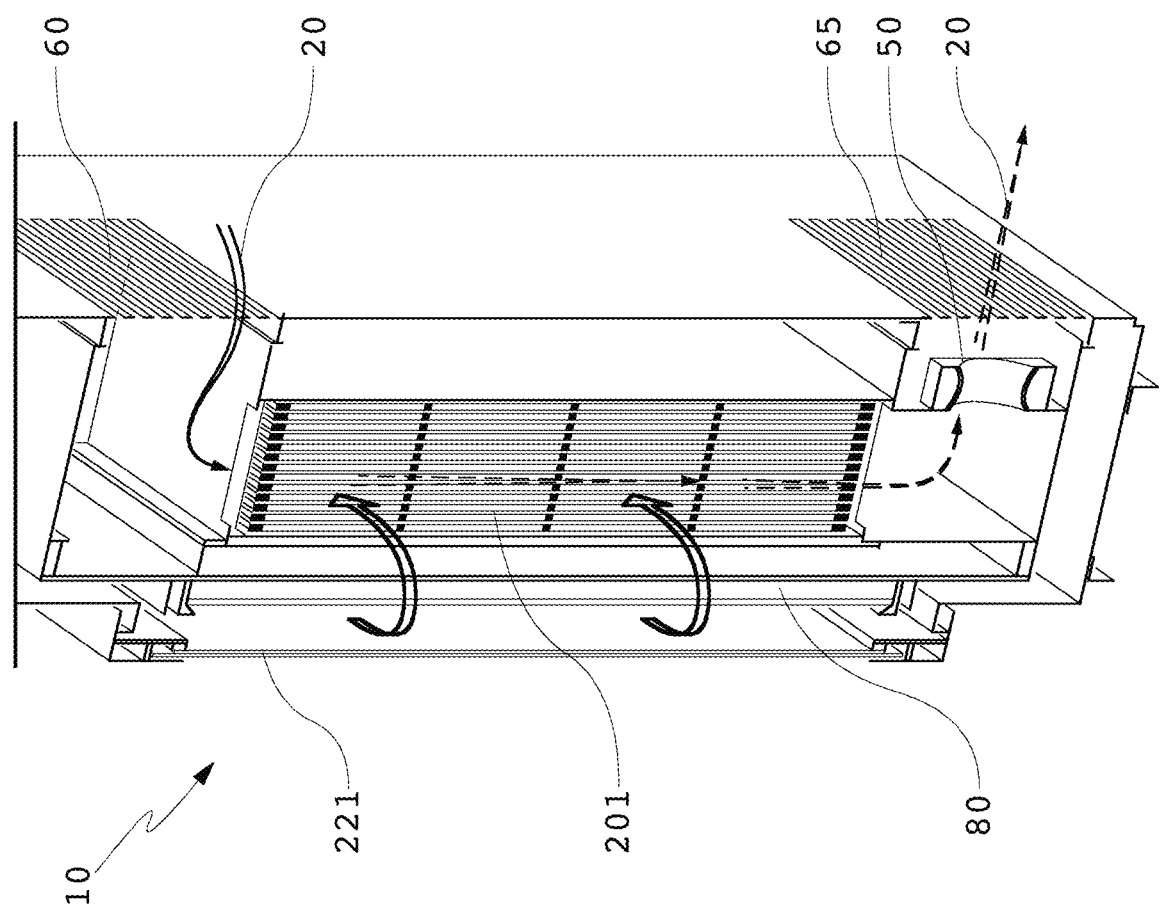
FIG. 3 is a perspective section of another embodiment where ambient gas is ingested only into the heat exchanger and not into optional additional channels.

FIG. 3 is a perspective section view of another embodiment of a display assembly 10 showing inlet 60 and exhaust 65 apertures for the ambient gas 20. The inlet aperture 60 may contain a screen or filter (removable or permanent) to remove any particulate (although this may not be necessary). One or more fans 50 may be positioned so as to draw the ambient gas 20 into the inlet aperture 60 and through the heat exchanger 201. In this embodiment, the ambient gas 20 is only drawn through the heat exchanger 201 and not through any additional optional channels. This embodiment may be used when the image assembly 80 (or backlight assembly) does not require the additional cooling of an additional channel. For example, and not by way of limitation, this embodiment 10 may be used when an OLED is used as the image assembly 80. Further, this embodiment 10 may be used when the LCD backlight is not generating large amounts of heat because it is not required to be extremely bright (perhaps because it is not used in direct sunlight). Still further, this embodiment may be used when the ambient gas 20 contains particulate or contaminates which may damage the display. In these situations, it may be desirable to limit the exposure of the display to the ambient gas 20. Thus, in these situations it may be desirable to only ingest ambient gas 20 into the heat exchanger 201 and not through any additional cooling channels.

In some embodiments, the ambient gas 20 may be air conditioned (or otherwise cooled) before it is directed into the heat exchanger 201. A front display surface 221 may be used to create an anterior (front) wall of the channel 290 and/or protect the image assembly 80 from damage. An exemplary front display surface 221 may be glass. Another embodiment for the front display surface 221 may be two panes of glass which are laminated together using optical adhesive. Solar loading (radiative heat transfer from the sun through the front display surface 221 may result in a heat buildup on the image assembly 80 (ex. OLED or LCD assembly). This heat may be transferred to the circulating gas as it passes through the channel between the front display surface 221 and the image assembly 80, where this heat may then be transferred to the ambient gas 20 and expelled from the display. The image assembly could be any one of the following: LCD, plasma display assembly, OLED, light emitting polymer (LEP) assembly, organic electro luminescence (OEL) assembly, LED display assembly, or any other flat/thin panel electronic display.

Figure 4:
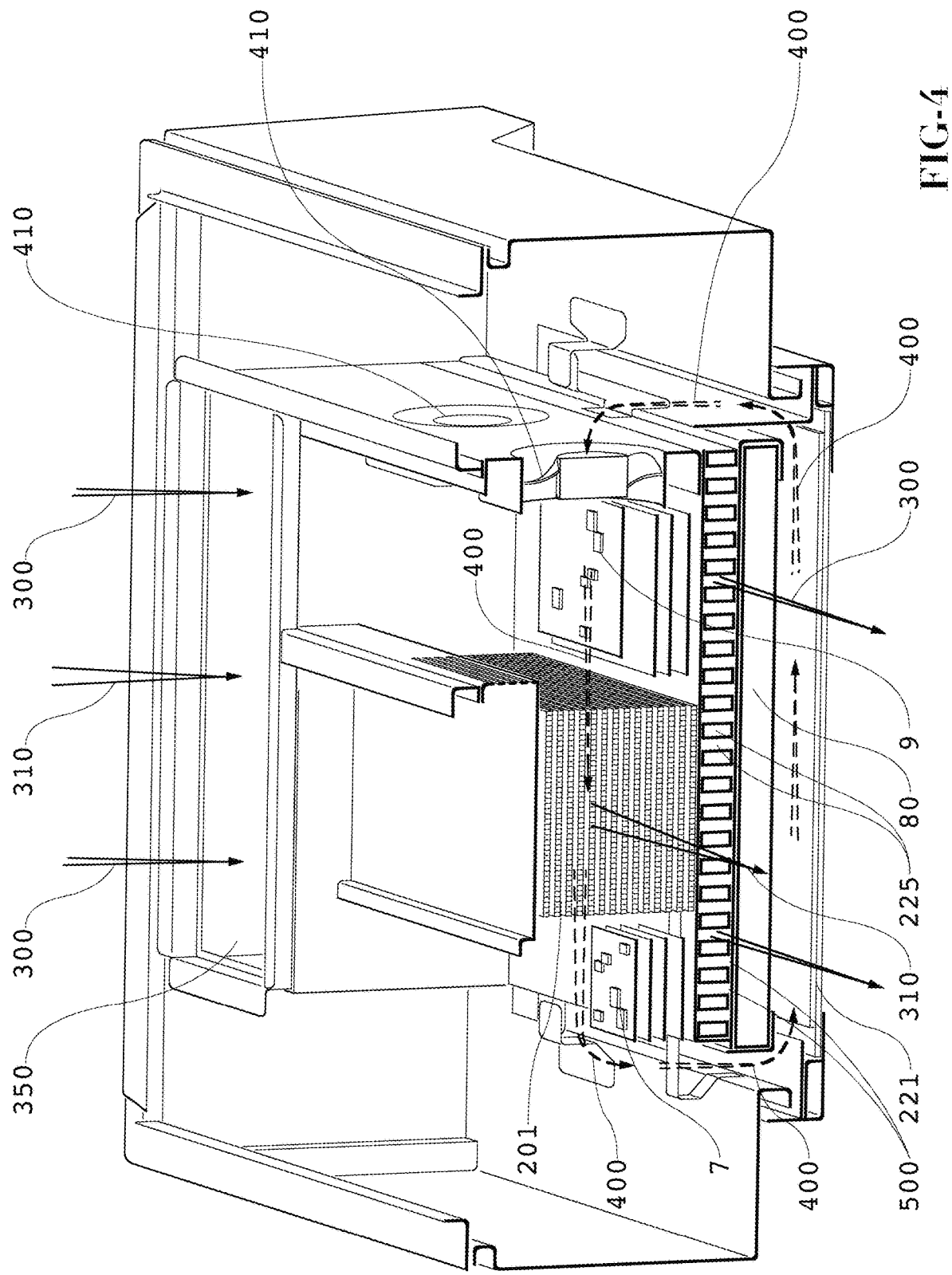
FIG. 4 is a perspective section view of an exemplary embodiment where a cross-flow heat exchanger is used to separate high power and low power electrical assemblies.

FIG. 4 shows another embodiment where a circulating gas 400 is forced between a front display surface 221 and an image assembly 80 and then through a heat exchanger 201 in order to remove at least a portion of the heat absorbed from the image assembly 80 and front display surface 221. Here, the circulating gas 400 may be propelled by a closed loop fan assembly 410. The heat exchanger 201 may accept circulating gas 400 in one direction while accepting ambient gas 310 in a substantially perpendicular direction such that heat may transfer between the two gases.

In this embodiment, an optional additional flow of ambient gas 300 is accepted through the inlet aperture 350 and directed along channel 225 in order to cool the rear portion of the image assembly 80 (possibly a backlight). When this optional additional flow of ambient gas 300 is used, it is preferable that the anterior (front) surface 500 of the channel 225 be thermally conductive and preferably in thermal communication with at least a portion of the image assembly 80. In this arrangement, the ambient gas 300 may also be used to absorb heat from the image assembly 80. In some embodiments, the image assembly may be an LCD with an LED backlight. Here, the LED backlight may be in thermal communication with surface 500 so that heat can be transferred from the LED backlight to the ambient gas 300. Alternatively, the image assembly 80 may be an OLED assembly and the surface 500 may be in thermal communication with the OLED assembly. Inlet aperture 350 may accept both ambient gas 310 and 300, or there may be separate inlet apertures for each flow of gas 310 and 300.

For the embodiment shown in FIG. 4, a plurality of ribs are shown placed within channel 225. These ribs may be thermally conductive and in thermal communication with surface 500. Thus, heat from surface 500 may be distributed throughout the ribs and removed by the ambient gas 300. It has been found, that this arrangement can provide improved cooling abilities for the image assembly 80 and/or backlight (if necessary). It can also provide greater structural rigidity to the overall assembly. It has been found that some image assemblies (especially LEDs and OLEDs) may have performance properties which vary depending on temperature. Thus, as the temperature of the image assembly increases, the luminance, color temperature, and other optical properties can vary. When 'hot spots' are present within a backlight or illumination assembly, these hot spots can result in irregularities in the resulting image which might be visible to the end user. Thus, with some of the embodiments described herein, the heat which may be generated by the backlight assembly or image assembly can be distributed throughout the ribs and thermally-conductive surfaces to remove hot spots and cool the backlight or image assembly.

The ribs shown in this embodiment contain a hollow rectangular cross-section, but this is not required. Other embodiments may contain ribs with I-beam cross-sections, hollow square cross-sections, solid rectangular or solid square cross-sections, 'T' cross-sections, 'Z' cross-sections, corrugated or honeycomb cross-section, or any combination or mixture of these. Metal may be used to produce the ribs in some embodiments.

In other embodiments, additional heat-producing electronic assemblies may be placed in thermal communication with the ribs so that heat can be removed from these assemblies as well. In an exemplary embodiment, power modules may be placed in thermal communication with the ribs so that the heat from the power modules can be distributed throughout the ribs and removed by the ambient gas 300.

The circulating gas 400 may also pass over electronic assemblies in order to accept heat from these electronic assemblies. In this exemplary embodiment, the electronic assemblies have been separated by the heat exchanger 201 into two groups. The first group of electronic assemblies 9 may be considered the high power assemblies and may include but are not limited to: power modules, inductors, transformers, and other power-related devices. The second group of electronic assemblies 7 may be considered the low power assemblies and may include but are not limited to: timing and control boards, hard drives and other storage devices, video cards, software drivers, microprocessors, and other control devices. It is known to those skilled in the art that some high power electronic assemblies can cause electrical interference with other electronic assemblies that may be sensitive to electrical interference. Thus, in the exemplary embodiment shown, the heat exchanger 201 is used to separate the lower power electronic assemblies 7 from the high power electronic assemblies 9 to ensure a minimum amount of interference between the two. Further, some high power electronic assemblies 9 are known to also generate heat. This heat may be transferred to the circulating gas 400 prior to introducing this gas into the heat exchanger 201. In the exemplary embodiment shown, ambient air can be ingested as the ambient gas 310 and there is little risk of damage to the electrical assemblies 7 and 9 because the ambient gas 310 would preferably never contact these electrical assemblies. However, the electrical assemblies 7 and 9 will remain cool (as well as clean and dry) because of the cross-flow from the circulating gas 400.

The cooling system described herein may run continuously. However, if desired, temperature sensing devices (not shown) may be incorporated within the electronic display to detect when temperatures have reached a predetermined threshold value. In such a case, the various cooling fans may be selectively engaged when the temperature in the display reaches a predetermined value. Predetermined thresholds may be selected and the system may be configured to advantageously keep the display within an acceptable temperature range. Typical thermostat assemblies can be used to accomplish this task. Thermocouples may be used as the temperature sensing devices. The speed of the various fan assemblies can also be varied depending on the temperature within the display.

It should be particularly noted that the spirit and scope of the disclosed embodiments provides for the cooling of any type of electronic display. By way of example and not by way of limitation, embodiments may be used in conjunction with any of the following: LCD (all types), light emitting diode (LED), organic light emitting diode (OLED), field emitting display (FED), light emitting polymer (LEP), organic electro luminescence (OEL), plasma displays, and any other type of thin/flat panel display. Furthermore, embodiments may be used with displays of other types including those not yet discovered. In particular, it is contemplated that the system may be well suited for use with large (55 inches or more) LED backlit, high definition (1080i or 1080p or greater) liquid crystal displays (LCD). While the embodiments described herein are well suited for outdoor environments, they may also be appropriate for indoor applications (e.g., factory/industrial environments, spas, locker rooms, kitchens, bathrooms) where thermal stability of the display may be at risk.

It should also be noted that the variety of open and closed cooling loops that are shown in the figures may be shown in a horizontal or vertical arrangement but it is clearly contemplated that this can be reversed or changed depending on the particular embodiment. Thus, the closed loop may run horizontally or vertically and in a clock-wise or counter-clockwise direction. Further, the open loop may also be horizontal or vertical and can run left to right, right to left, and top to bottom, or bottom to top.

Having shown and described various exemplary embodiments, those skilled in the art will realize that many variations and modifications may be made thereto without departing from the scope of the inventive concept. Additionally, many of the elements indicated above may be altered or replaced by different elements that will provide a like result and fall within the spirit of the inventive concept. It is the intention, therefore, to limit the inventive concept only as indicated by the scope of the claims.

What is claimed is:

1. An electronic display assembly comprising:
a housing having an intake and an exhaust;
an electronic display located within the housing, said electronic display comprising a liquid crystal display stack and a backlight assembly, said backlight assembly located rearward of the liquid crystal display stack such that the first portion of the first airflow pathway extends proximate a rear surface of the backlight assembly;
a first airflow pathway fluidly connected to an ambient environment and extending through the housing between the intake and the exhaust, where a first portion of the first airflow pathway extends proximate to a rear surface of the electronic display and a second portion of the first airflow pathway extends rearward of, and is spaced apart from, the rear surface of the electronic display;
a second airflow pathway, separated from the first airflow pathway, and forming a closed, continuous pathway within the housing, wherein at least a portion of said second airflow pathway is located rearward of the electronic display, wherein the second airflow pathway extends, at least in part, rearward of the first portion of the first airflow pathway; and
one or more electronic assemblies for operating the electronic display assembly located within the portion of the second airflow pathway located rearward of the electronic display.

2. The electronic display assembly of claim 1 wherein:
the rear surface of the backlight assembly comprises a thermally conductive material.

3. The electronic display assembly of claim 2 wherein:
the thermally conductive material comprises a metal.

4. The electronic display assembly of claim 3 wherein:
the thermally conductive material comprises aluminum.

5. The electronic display assembly of claim 2 wherein:
the first portion of the first airflow pathway extends directly along the rear surface of the backlight assembly with no intervening airflow pathways.

6. The electronic display assembly of claim 5 wherein:
the first portion of the first airflow pathway directly contacts the rear surface of the backlight assembly.

7. The electronic display assembly of claim 1 wherein:
the second portion of the first airflow pathway extends, at least in part, interior to the second airflow pathway.

8. The electronic display assembly of claim 7 wherein:
the first airflow pathway is separated at a first location adjacent to said intake into a first sub-pathway and a second sub-pathway;
the first sub-pathway includes the first portion of the first airflow pathway; and
the second sub-pathway includes the second portion of the first airflow pathway.

9. The electronic display assembly of claim 8 wherein:
the first sub-pathway and the second sub-pathway extend primarily in a same direction; and
the first sub-pathway and the second sub-pathway are rejoined at a second location adjacent to said exhaust.

10. The electronic display assembly of claim 8 further comprising:

one or more barriers, spaced apart from the electronic display, which provide, at least in part, a level of fluid separation between the second airflow pathway and the first airflow pathway.

11. The electronic display assembly of claim 10 wherein:
the level of fluid separation is sufficient to prevent particulate above a certain size from entering the second airflow pathway, but is less well sealed than a hermetic seal.

12. The electronic display assembly of claim 11 wherein:
the one or more barriers comprise a panel;
the first portion of the first airflow pathway extends between the panel and the rear surface of the electronic display, and wherein the panel defines, at least in part, the second airflow pathway; and
said one or more electronic assemblies are connected to the panel.

13. The electronic display assembly of claim 12 further comprising:
one or more ribs located along the panel to enhance heat transfer.

14. The electronic display assembly of claim 12 further comprising:
the panel comprises a solid, metal surface.

15. The electronic display assembly of claim 12 wherein:
said one or more electronic assemblies comprising:
 a first group of electronic assemblies comprising relatively high-power assemblies comprising one or more of: power modules, inductors, and transformers; and
 a second group of electronic assemblies comprising relatively low-power assemblies comprising one or more of: timing and control boards, hard drives and other storage devices, video cards, software drivers, and microprocessors.

16. The electronic display assembly of claim 15 further comprising:
a first fan located at the first airflow pathway for moving ambient air through some or all of the first airflow pathway when activated; and
a second fan located at the second airflow pathway for moving ambient air through some or all of the second airflow pathway when activated, wherein the first group of electronic assemblies supply power to at least the electronic display, the first fan, and the second fan.

17. The electronic display assembly of claim 16 wherein:
activation of the first fan is configured to move said ambient air, which is relatively cool, through the first airflow pathway to absorb heat generated by the image assembly during operation and absorb heat from relatively warm circulating as within the second airflow pathway; and
activation of the second fan is configured to move the relatively warm circulating gas through the second airflow pathway to absorb heat generated by the one or more electronic assemblies during operation and disburse said absorbed heat to the relatively cool ambient air.

18. The electronic display assembly of claim 15 wherein:
the first group of electronic assemblies are configured to supply at least a majority of available operational power for the electronic display assembly.

19. The electronic display assembly of claim 15 wherein:
a portion of the second airflow pathway located rearward of the electronic display is separated, in part, into a first subsection and a second subsection by an intermediary structure;
the first group of electronic assemblies are located in the first subsection; and
the second group of electronic assemblies are located in the second subsection.

20. The electronic display assembly of claim 19 wherein:
the intermediary structure comprises a heat exchanger located rearward of the electronic display and forming part of the first airflow pathway and the second airflow pathway, said heat exchanger comprising a plurality of ducted passageways, a first subset of multiple ones of which provide at least part of the first airflow pathway and a second subset of multiple ones of which provide at least part of the second airflow pathway.

21. The electronic display assembly of claim 12:
wherein the second airflow pathway comprises a first portion located forward of the electronic display and a second portion located rearward of the electronic display and the panel, thereby forming a closed loop about the electronic display;
further comprising:
 a cover layer located forward of the electronic display and forming part of the housing, wherein the first portion of the second airflow pathway extends between the cover layer and the electronic display; and
 a heat exchanger located rearward of the electronic display and forming part of the first airflow pathway and the second airflow pathway, said heat exchanger comprising a plurality of ducted passageways, a first subset of multiple ones of which provide at least part of the second sub-pathway and a second subset of multiple ones of which provide at least part of the second airflow pathway.

22. An electronic display assembly comprising:
a housing;
an intake located at a first portion the housing;
an exhaust located at a second portion the housing;
an electronic display located within the housing and comprising a liquid crystal display (LCD) stack and a backlight assembly rearward of the LCD stack;
a first airflow pathway extending within the housing between the intake and the exhaust, wherein, within the housing, said first airflow pathway comprises a first sub-pathway extending proximate to a rear surface of the backlight assembly and a second, distinct sub-pathway located rearward of the electronic display and spaced apart from the rear surface of the backlight assembly;
a first fan located along the first airflow pathway;
a second airflow pathway forming a closed, continuous pathway within the housing, and extending, at least in part, rearward and spaced apart from, the electronic display and at least the first sub-pathway of the first airflow pathway, wherein said second airflow pathway is separated from the first airflow pathway;
a second fan located along the second airflow pathway;
a panel spaced apart from the backlight assembly and providing at least some of the separation between the first airflow pathway and the second airflow pathway, wherein the first sub-pathway of the first airflow pathway extends, at least in part, between a forward surface of the panel and a rear surface of the backlight assembly, and the second airflow pathway and the second sub-pathway of the first airflow pathway extends, at least in part, behind a rear surface of the panel; and
electronic assemblies for operating the electronic display assembly connected to the rear surface of the panel and within the second airflow pathway, said electronic assemblies comprising a timing and control board for the LCD stack and one or more power modules for the electronic display, the first fan, and the second fan.

23. An electronic display assembly comprising:
a housing;
an intake located at a first portion of the housing;
an exhaust located at a second portion of the housing;
an electronic display located within the housing and comprising a liquid crystal display stack and a backlight assembly;
a first airflow pathway extending between the intake and the exhaust, wherein said first airflow pathway, within said housing, comprises a first sub-pathway and a distinct, second sub-pathway, where said first sub-pathway extends proximate to a rear surface of the backlight assembly and said second sub-pathway located rearward of, and spaced apart from, the rear surface of the backlight assembly, said first and second sub-pathways being fluidly connected to one another;
fans located along the first airflow pathway, which when activated, move ambient air through the first airflow pathway, including through the first and second sub-pathways;
a second airflow pathway forming a closed, continuous pathway within the housing and comprising a rear chamber which is, at least in part, located behind and spaced apart from, the electronic display, behind the first sub-pathway of the first airflow pathway, and adjacent to the second sub-pathway of the first airflow pathway, where said second airflow pathway is separated from the ambient environment and the first airflow pathway at a level sufficient to keep particulate above a certain size from entering the second airflow pathway, but is less well sealed than a hermetic seal;
one or more additional fans located along the second airflow pathway, which when activated, circulate gas within the closed, continuous pathway;
a panel spaced apart from the backlight assembly and providing, at least in part, the separation between the first airflow pathway and the second airflow pathway, wherein the first sub-pathway of the first airflow pathway extends, at least in part, between a forward surface of the panel and a rear surface of the backlight assembly, and a rear surface of the panel defines, at least in part, the rear chamber;
electronic assemblies for operating the electronic display assembly, including at least the electronic display, the first fan, and the second fan, said electronic assemblies connected to the rear surface of panel such that said electronic assemblies are located within the rear chamber of the second airflow pathway, said electronic assemblies comprising:
  a first group of electronic assemblies comprising relatively high-power assemblies comprising one or more of: power modules, inductors, and transformers electrically connected to at least the electronic display, the first fan, and the second fan to supply electrical power to the same; and
  a second group of electronic assemblies comprising relatively low-power assemblies comprising one or more of: timing and control boards, hard drives and other storage devices, video cards, software drivers, and microprocessors electrically connected to at least the electronic display, the first fan, and the second fan to supply electronic commands to the same; and
a structure within the rear chamber at least partially separating the first group of electronic assemblies from the second group of electronic assemblies.

* * * * *

UNITED STATES PATENT AND TRADEMARK OFFICE
CERTIFICATE OF CORRECTION

| | | |
|---|---|---|
| PATENT NO. | : 12,274,022 B2 | Page 1 of 1 |
| APPLICATION NO. | : 18/657113 | |
| DATED | : April 8, 2025 | |
| INVENTOR(S) | : William Dunn et al. | |

It is certified that error appears in the above-identified patent and that said Letters Patent is hereby corrected as shown below:

On the Title Page

Item (56), References Cited, U.S. Patent Documents, please delete "7,212,403 B2 5/2007 Rockenfell" and insert -- 7,212,403 B2 5/2007 Rockenfeller --.

In the Specification

In Column 5, Line 5, please delete "plates)." and insert -- plates. --.

In the Claims

In Column 11, Line 51, Claim 17, please delete "as" and insert -- gas --.

Signed and Sealed this
Twenty-fourth Day of June, 2025

Coke Morgan Stewart
*Acting Director of the United States Patent and Trademark Office*